(12) United States Patent
Hill et al.

(10) Patent No.: US 12,425,108 B2
(45) Date of Patent: Sep. 23, 2025

(54) SWITCHING INTERVAL MODULATION WITH PULSE ENCODED TRANSITIONS

(71) Applicant: The Regents of the University of California, Oakland, CA (US)

(72) Inventors: Cameron Hill, Goleta, CA (US); James F. Buckwalter, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 685 days.

(21) Appl. No.: 17/614,063

(22) PCT Filed: May 14, 2020

(86) PCT No.: PCT/US2020/032910
§ 371 (c)(1),
(2) Date: Nov. 24, 2021

(87) PCT Pub. No.: WO2020/242778
PCT Pub. Date: Dec. 3, 2020

(65) Prior Publication Data
US 2022/0239384 A1    Jul. 28, 2022

Related U.S. Application Data

(60) Provisional application No. 62/855,133, filed on May 31, 2019.

(51) Int. Cl.
*H04B 15/00* (2006.01)
*H03D 1/00* (2006.01)
(Continued)

(52) U.S. Cl.
CPC ............... *H04B 15/00* (2013.01); *H03D 1/00* (2013.01); *H03K 19/21* (2013.01);
(Continued)

(58) Field of Classification Search
CPC .... H04N 7/16; H04B 15/00; H04B 10/25752; H03K 19/21; H03D 1/00; H03D 2200/007;
(Continued)

(56) References Cited

U.S. PATENT DOCUMENTS 6,493,878 B1 * 12/2002 Kassatly ............... H04N 9/8042
375/E7.268
2016/0218725 A1   7/2016 Stoner
(Continued)

OTHER PUBLICATIONS

Optics Letters, Vo et al., Photonic XOR gate DPSK application (Year: 2011).*
(Continued)

*Primary Examiner* — Arnold M Kinkead
(74) *Attorney, Agent, or Firm* — Greer, Burns & Crain, Ltd.; Steven P. Fallon

(57) ABSTRACT

A method for switching interval modulation includes modulating an RF input data signal while generating and inserting additional pulses in transitions of the data signal. The additional pulses are structured to shift transition noise into higher order harmonics. Higher order harmonics are easily filtered. The generating is conducted in the digital domain. The additional pulses can be used to simplify the transmit chain through optical modulators and improve the signal integrity over long distances, can be applied at the output of a transmitter to filter power amplifier distortion, and can be applied to non-linear RF over fiber for a distributed MIMO system.

9 Claims, 33 Drawing Sheets

(51) Int. Cl.
*H03K 19/21* (2006.01)
*H04B 10/2575* (2013.01)
*H04L 25/49* (2006.01)

(52) U.S. Cl.
CPC .............. *H04B 10/25752* (2013.01); *H04L 25/4902* (2013.01); *H03D 2200/007* (2013.01); *H03D 2200/0086* (2013.01)

(58) Field of Classification Search
CPC .... H03D 2200/0086; H03C 2200/0045; H03C 1/00; H04L 25/4902
USPC ......... 725/144, 151; 370/477, 480; 332/112; 398/115, 202; 375/298
See application file for complete search history.

(56) References Cited

U.S. PATENT DOCUMENTS

| 2017/0194688 A1* | 7/2017 | Sharma | H01P 1/18 |
| 2018/0069535 A1 | 3/2018 | Song et al. | |
| 2019/0044506 A1 | 2/2019 | Naumann | |

OTHER PUBLICATIONS

Hill et al., "RF Watt-Level Low-Insertion-Loss High-Bandwidth SOI CMOS Switches", IEEE Transactions on Microwave Theory and Techniques, 2018, pp. 5724-5736, vol. 66, No. 12, IEEE.

International Search Report and Written Opinion from the corresponding International Patent Application No. PCT/US2020/032910, dated Jul. 6, 2020.

Balteanu et al., "A 45-GHz, 2-bit Power DAC with 24.3 dBm Output Power, >14 Vpp Differential Swing, and 22% Peak PAE in 45-nm SOI CMOS", 2012 IEEE Radio Frequency Integrated Circuits Symposium, 2012, pp. 319-322, IEEE.

Balteanu et al., "A 2-Bit, 24 dBm, Millimeter-Wave SOI CMOS Power-DAC Cell for Watt-Level High-Efficiency, Fully Digital m-ary QAM Transmitters", IEEE Journal of Solid-State Circuits, 2013, pp. 1126-1137, vol. 48, No. 5, IEEE.

Balteanu et al., "A High Modulation Bandwidth, 110GHz Power-DAC Cell for IQ Transmitter Arrays With Direct Amplitude and Phase Modulation", IEEE Journal of Solid-State Circuits, 2014, pp. 2103-2113, vol. 49, No. 10, IEEE.

Shopov et al., "Ultra-Broadband I/Q RF-DAC Transmitters", IEEE Transactions on Microwave Theory and Techniques, 2017, pp. 5411-5421, vol. 65, No. 12, IEEE.

Thome et al., "A W-Band Wireless Communication Transmitter Utilizing a Stacked-FET Oscillator for High Output Power Performance", 2016 IEEE MTT-S International Microwave Symposium (IMS), 2016, pp. 1-4, IEEE.

Xu et al., "A Direct Antenna Modulation (DAM) Transmitter with a Switched Electrically Small Antenna", 2010 International Workshop on Antenna Technology (iWAT), 2010, pp. 1-4, IEEE.

Yao et al., "Radiating beyond the Bandwidth Using Direct Antenna Modulation", IEEE Antennas and Propagation Society Symposium, 2004, pp. 791-794, vol. 1, IEEE.

Schab et al., "Calculation of radiation transients in direct antenna modulation systems", 2017 IEEE International Symposium on Antennas and Propagation & USNC/URSI National Radio Science Meeting, 2017, pp. 521-522, IEEE.

Alshammary et al., "A λ/4-Inverted N-path Filter in 45-nm CMOS SOI for Transmit Rejection with Code Selective Filters", 2018 IEEE/MTT-S International Microwave Symposium—IMS, 2018, pp. 1370-1373, IEEE.

Hamza et al., "A Series N-Path Code Selective Filter for Transmitter Rejection in Full-Duplex Communication", IEEE Microwave and Wireless Components Letters, 2019, pp. 38-40, vol. 29, No. 1, IEEE.

Jayaraman et al., "Linear High-Efficiency Microwave Power Amplifiers Using Bandpass Delta-Sigma Modulators", IEEE Microwave and Guided Wave Letters, 1998, pp. 121-123, vol. 8, No. 3, IEEE.

Wang et al., "An Improved Kahn Transmitter Architecture Based on Delta-Sigma Modulation", IEEE MTT-S International Microwave Symposium Digest, 2003, pp. 1327-1330, vol. 2, IEEE.

Dupuy et al., "High Efficiency Power Transmitter Based on Envelope Delta-Sigma Modulation (EDSM)", IEEE 60th Vehicular Technology Conference, 2004, pp. 2092-2095, vol. 3, IEEE.

Hausmair et al., "Aliasing-Free Digital Pulse-Width Modulation for Burst-Mode RF Transmitters", IEEE Transactions on Circuits and Systems—I: Regular Papers, 2013, pp. 415-427, vol. 60, No. 2, IEEE.

Gustavsson et al., "A General Method for Passband Quantization Noise Suppression in Pulsed Transmitter Architectures", 2009 IEEE MTT-S International Microwave Symposium Digest, 2009, pp. 1529-1532, IEEE.

Hill et al., "A 1.5-dB Insertion Loss, 34-dBm P1dB Power Modulator with 46% Fractional Bandwidth in 45-nm CMOS SOI", 2019 IEEE/MTT-S International Microwave Symposium, 2019, pp. 243-246, IEEE.

Tang et al., "A Harmonic Cancellation Technique for an Ultrasound Transducer Excited by a Switched-Mode Power Converter", IEEE Transactions on Ultrasonics, Ferroelectrics, and Frequency Control, 2008, pp. 359-367, vol. 55, No. 2, IEEE.

Smith et al., "Width-Modulated Square-Wave Pulses for Ultrasound Applications", IEEE Transactions on Ultrasonics, Ferroelectrics, and Frequency Control, 2013, pp. 2244-2256, vol. 60, No. 11, IEEE.

Weldon et al., "A 1.75-GHz Highly Integrated Narrow-Band CMOS Transmitter With Harmonic-Rejection Mixers", IEEE Journal of Solid-State Circuits, 2001, pp. 2003-2015, vol. 36, No. 12, IEEE.

Jeon et al., "A Pulsed Dynamic Load Modulation Technique for High-Efficiency Linear Transmitters", IEEE Transactions on Microwave Theory and Techniques, 2015, pp. 2854-2866, vol. 63, No. 9, IEEE.

Jeong et al., "Pulsed Load Modulation (PLM) Technique for Efficient Power Amplification", IEEE Transactions on Circuits and Systems—II: Express Briefs, 2008, pp. 1011-1015, vol. 55, No. 10, IEEE.

Ebrahimi et al., "Reducing Quantization Noise to Boost Efficiency and Signal Bandwidth in Delta-Sigma-Based Transmitters", IEEE Transactions on Microwave Theory and Techniques, 2013, pp. 4245-4251, vol. 61, No. 12, IEEE.

Levy et al., "A CMOS SOI Stacked Shunt Switch with Sub-500ps Time Constant and 19-Vpp Breakdown", 2013 IEEE Compound Semiconductor Integrated Circuit Symposium (CSICS), 2013, pp. 1-4, IEEE.

* cited by examiner

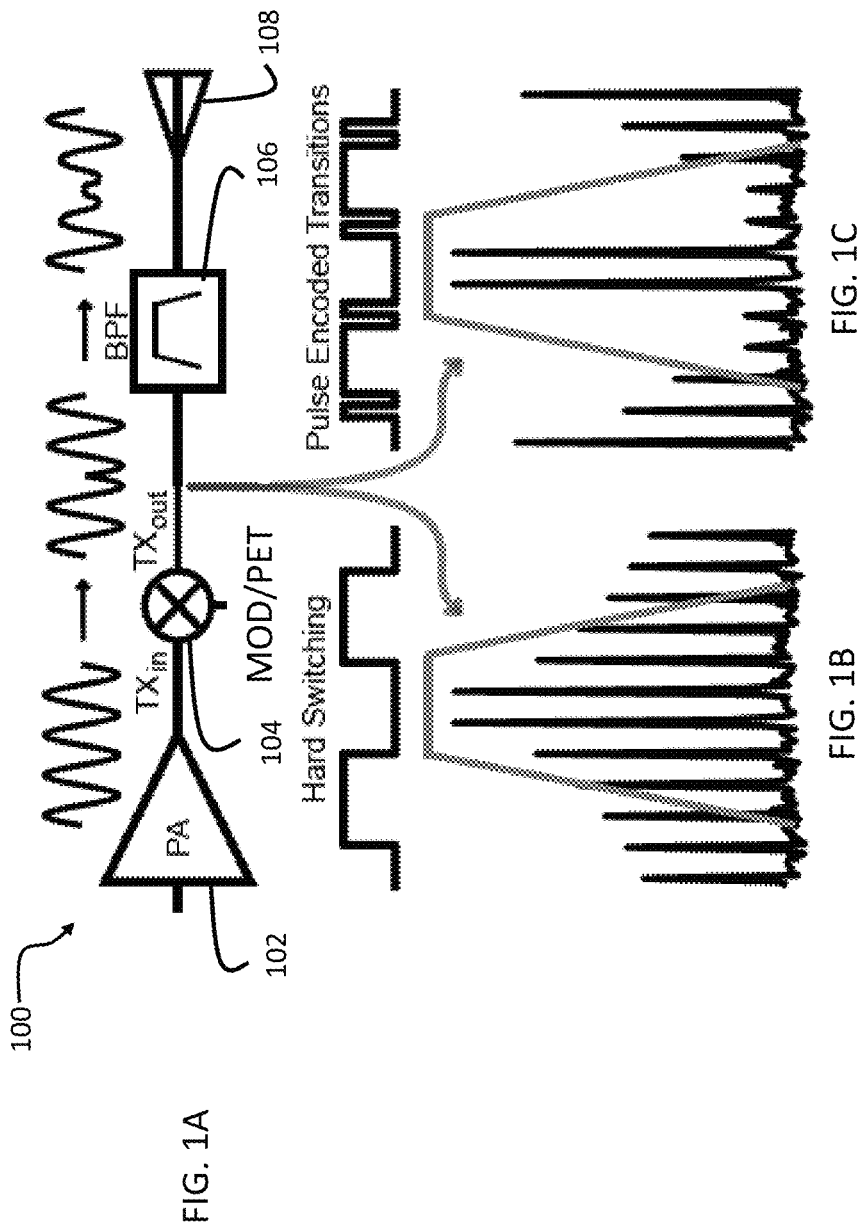

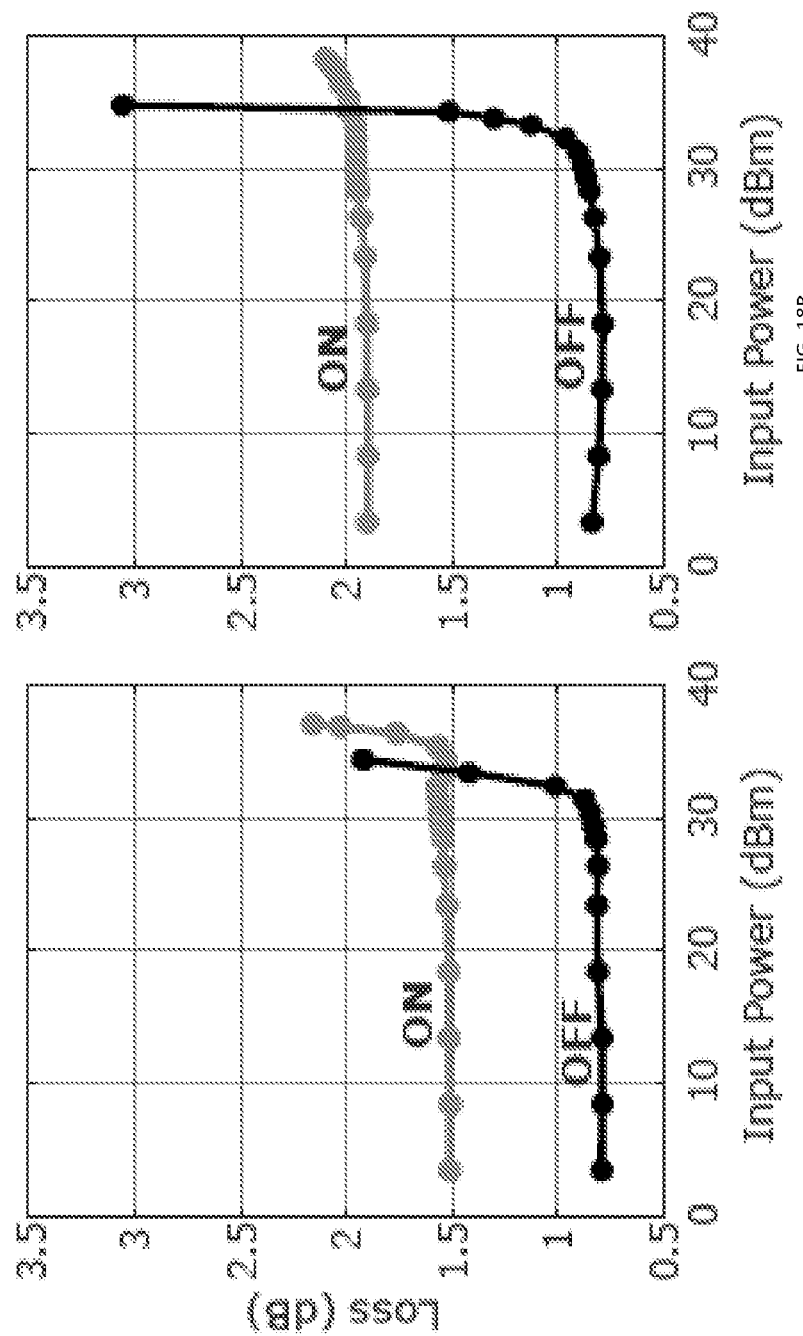

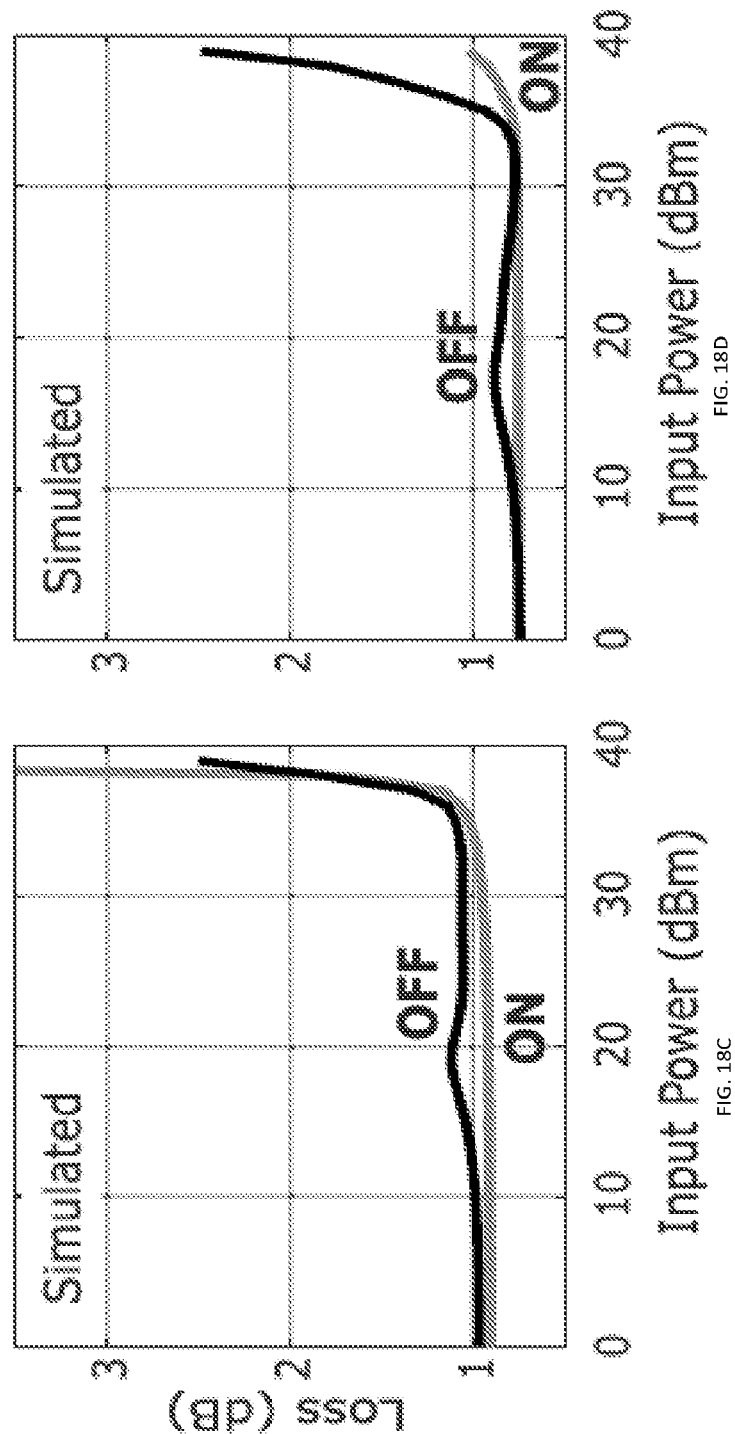

SWITCHING INTERVAL MODULATION WITH PULSE ENCODED TRANSITIONS

PRIORITY CLAIM AND REFERENCE TO RELATED APPLICATION

The application claims priority under 35 U.S.C. § 119 and all applicable statutes and treaties from prior U.S. provisional application Ser. No. 62/855,133, which was filed May 31, 2019.

STATEMENT OF GOVERNMENT INTEREST

This invention was made with government support under grant number HR0011-17-2-0003 awarded by the Defense Advanced Research Projects Agency. The government has certain rights in the invention.

FIELD

A field of the invention is modulation, particularly direct RF modulation (DRFM) and wireless communications.

TABLE OF ABBREVIATIONS
The following abbreviations are used throughout to improved readability of the written description.

| | |
|---|---|
| ACLR | Adjacent Channel Leakage Ratio |
| AWG | Arbitrary Waveform Generator |
| BPF | Bandpass Filter |
| BPSK | Binary Phase Shift Keying |
| BW | Bandwidth |
| CBW | Cancellation-bandwidth |
| DRFM | Direct Radio Frequency Modulation |
| FBW | Fractional Bandwidth |
| HD | Harmonic Distortion |
| IL | Insertion Loss |
| IIP3 | Third Order Intercept Point |
| MIMO | Multiple Input, Multiple Output |
| RF | Radio Frequency |
| RPS | Reflection Phase Shifter |
| PA | Power Amplifier |
| PAPR | Peak-to-Average Power Ratio |
| PET | Pulse Encoded Transitions |
| PSD | Power Spectral Density |
| PWM | Pulse Width Modulation |
| OOB | Out of Band |
| OSR | Oversampling Ratio |
| PCB | Printed Circuit Board |
| QPSK | Quadrature Phase Shift Keying |
| SOI | Silicon-on-Insulator |
| TX | Transmit |

BACKGROUND

Out of band signal leakage is an important problem in any RF system that can lead to significant interference. Unwanted harmonic emissions in a transmitted signal interfere with other transmitted signals in the applicable RF bandwidth. DRFM supports high-efficiency RF signaling for wideband TX chains. Earlier demonstrations of DRFM include direct I/Q modulation, direct antenna modulation, and wideband RF signal code-domain full duplex techniques.

An existing problem with DRFM is that high-speed switching techniques at the antenna produce aliases and contribute significant ACLR as shown in FIG. 1B. Attempting to use a bandpass filter before the antenna to reduce the ACLR is impractical and demands narrow-band filter banks that introduce a large insertion loss. Typically, predistortion is used to control the ACLR but doing so in DRFM systems would counteract the efficiency, and PAPR benefits of DRFM. Other alternatives to reduce the ACLR include Σ—Δ modulation (ΣΔM) in conjunction with a BPF (band pass filter) at the output to shift the aliases to higher frequencies and ease filtering requirements. However, this requires significant digital processing power in addition to increasing the sampling rate of the available DACs by more than 100-fold to get sufficient ACLR reduction.

DRFM also suffers a trade-off between high power handling and high switching bandwidth. Past approaches have developed high bandwidth, high power modulators in CMOS using stacked-FET switches to show power handling of more than 30 dBm and fractional switching bandwidths (FBWs) of more than 50% with losses of <I dB. However, these high-power modulators have relied on off-chip baluns to create a differential signal for which the losses are not accounted and offset any efficiency benefit that might be attained through DRFM. See, e.g., C. Hill, C. S. Levy, H. AlShammary, A. Hamza, and J. F. Buckwalter, "RF watt-level low-insertion-loss high-bandwidth SOI CMOS switches," IEEE Trans. on Microw. Theory and Techn., vol. 66, no. 12, pp. 5724-5736, December 2018.

Pulse encoded transition approaches seek to modify the pulse widths in data transitions to rejected aliased signal power. Past efforts seek to cancel harmonic content through calculation of pulse widths that emulate smooth transitions. See, S. C. Tang and G. T. Clement, "A harmonic cancellation technique for an ultrasound transducer excited by a switched-mode power converter," in IEEE Ultrason. Symp., November 2008, pp. 2076-2079; P. R. Smith, D. M. J. Cowell, and S. Freear, "Width-modulated square-wave pulses for ultrasound applications," IEEE Trans. on Ultrason., Ferroelect., and Freq. Control, vol. 60, no. 11, pp. 2244-2256, November 2013. Another approach adds phase-shifted square waves to eliminate harmonic content of a mixer drive signal. J. A. Weldon, R. S. Narayanaswami, J. C. Rudell, M. Otsuka, S. Dedieu, and P. R. Gray, "A 1.75-gHz highly integrated narrow-band CMOS transmitter with harmonic-rejection mixers," IEEE J. of Solid-State Circuits, vol. 36, no. 12, pp. 2003-2015, December 2001. These approaches use both pulse-width and analog modulation, which creates significant analog complexity at high-order approximate arbitrary waveform generation.

SUMMARY OF THE INVENTION

A preferred embodiment provides a method for switching interval modulation includes modulating an RF input data signal while generating and inserting additional pulses in transitions of the data signal. The additional pulses are structured to shift transition noise into higher order harmonics. Higher order harmonics are easily filtered. The generating is conducted in the digital domain. The additional pulses can be used to simplify the transmit chain through optical modulators and improve the signal integrity over long distances, can be applied at the output of a transmitter to filter power amplifier distortion, and can be applied to non-linear RF over fiber for a distributed MIMO system.

A preferred embodiment provides a pulse encoding circuit for switching interval modulation comprising: an edge detector and a tunable delay that receive an original RF oscillation signal, along with XOR logic to generate pulses and add them to transitions in the original RF oscillation signal, wherein the pulses are structured to shift transition noise into higher order harmonics.

A preferred embodiment provides modulation circuit for switching interval modulation, comprising: a reflection-based phase shifter, the phase shifter having a hybrid coupler and switches to change the phase of the hybrid coupler, wherein the switches comprise primary switches and smaller stacked secondary switches sized and configured to present a high impedance at gates of the primary switches and allow the gate nodes of primary switches to swing with its drain and source nodes to prevent voltage breakdown.

BRIEF DESCRIPTION OF THE DRAWINGS

FIGS. 1A-1C respectively show a TX chain used in direct RF modulators; an example spectrum using square pulses with significant in-band content that cannot be removed by the filter profile imposed on the waveform; and the illustrated spectrum when using the present digital PETs to eliminate in-band spectral components in accordance with a preferred method of the invention;

FIGS. 18A-18D are measured compression characteristics of the 12-stack RPS, the 8-stack RPS and simulated power compression of 12-stack RPS and the 8-stack RPS;

FIG. 30 is a schematic of a preferred embodiment distributed MIMO PET system.

DETAILED DESCRIPTION OF THE PREFERRED EMBODIMENTS

Figures 2A, 2B, 2C:
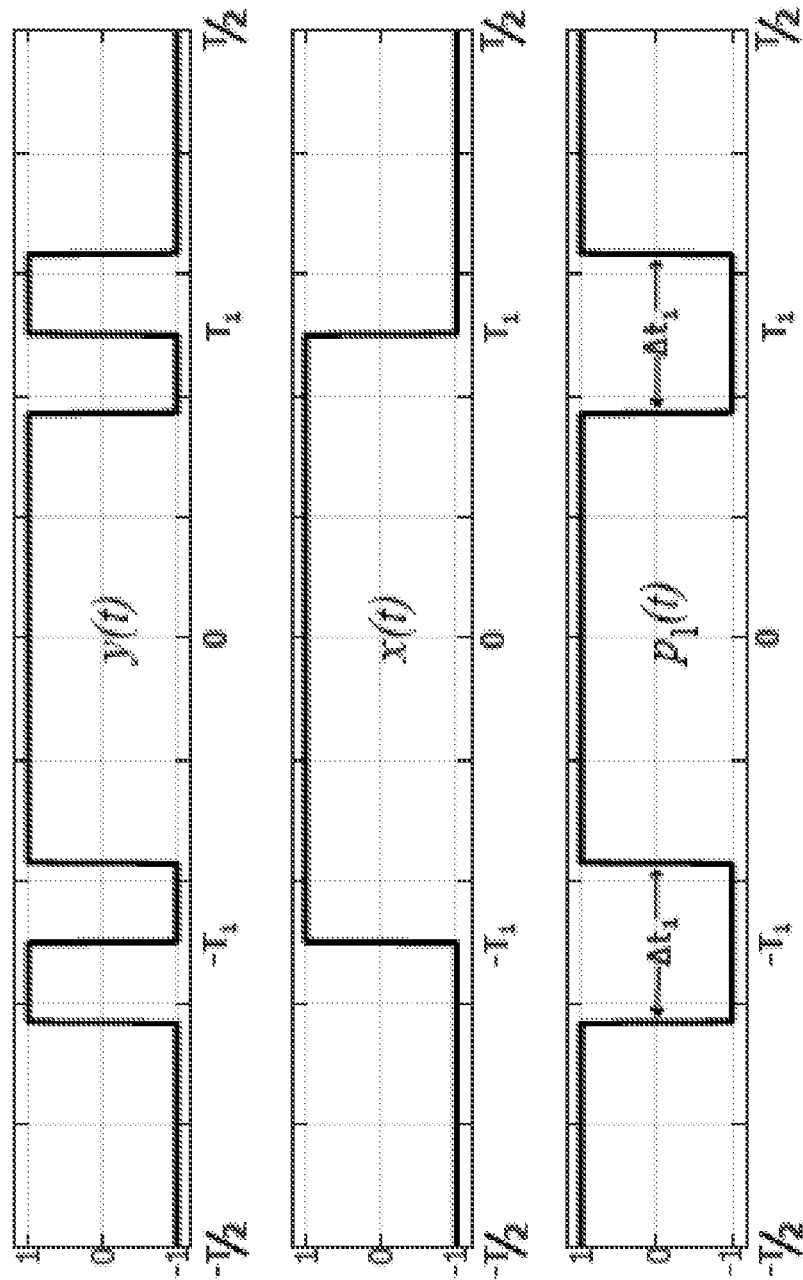
FIGS. 2A-2C respectively show a decomposition of an approximated band-limited square wave into more easily defined parts, an original square wave, and a pair of pulses of width $\Delta_{t1}$ centered at the transitions of the original square wave.

A preferred embodiment provides a method to reduce unwanted harmonic content from a digital signal. In the method, additional switching intervals are employed on each edge of transmitted data to systematically cancel unwanted harmonics. Pulse encoded transitions are constructed and inserted to cancel out-of-band harmonics that would otherwise cause significant interference to other uses in the RF environment. The present method, in contrast to prior methods discussed in the background, does not employ any sophisticated filters (e.g., raised cosine), or feedback transfer functions (sigma-delta modulators). This permits lower power operation. Additionally, switching bandwidth required to reduce or eliminate out-of-band content is significantly relaxed by the present method compared to conventional techniques.

Methods and transmitters of the invention address ACLR reduction in DRFM through the present digital PET method that can be applied directly at the power modulator. The digital PET waveforms add switching intervals during each transition in the RF phase to shift the harmonic content away from the band of interest to higher frequencies where it is easier to filter with a simple bandpass filter.

A preferred RF power modulator of the invention has an RPS architecture with a switch stack having tapered switches. The stacked and tapered switches are formed in an example embodiment in 45 nm SOI CMOS and provide voltage handling of 23V, excellent bandwidth and signal to noise ratios. By designing switches for these RPS modulators in 45-nm silicon on insulator (SOI) CMOS with the stacked and tapering architecture, a peak voltage handling of 23 V with high switching bandwidth is achieved. Experiments demonstrated the measured characteristics of the RPS modulators with the power handling of 34 dBm and FBWs of nearly 50%, and their use of the present PET to reduce ACLR to −50 dBc.

Other modulator architectures can also incorporate the present digital PET method. Example modulator alternatives to the reflection phase shifter architecture are disclosed in Hill et al., "A 30.9 dBm, 300 MHz 45-nm SOI CMOS Power Modulator for Spread-Spectrum Signal Processing at the Antenna," 2018 IEEE/MTT-S International Microwave Symposium; and Hill et. al., "RF Watt-Level, Low-Insertion-Loss, High-Bandwidth SOI CMOS Switches," IEEE Transactions on Microwave Theory and Techniques (Volume: 66, Issue: 12, December 2018).

Methods and transmitters of the invention can reduce interference in any RF system at a lower power cost and lower system requirements than in previous technology. This can provide better performance (higher data rates), less power, (longer battery life), and less interference (better signal integrity).

Preferred embodiments of the invention will now be discussed with respect to the drawings and experiments used to demonstrate the invention. The drawings may include schematic representations, which will be understood by artisans in view of the general knowledge in the art and the description that follows.

FIG. 1A shows DRFM architecture 100 where a PA 102 is followed by a power modulator/PET distorter 104 and BPF 106 to reduce GOB transmit power transmitted by an antenna 108. PET is implemented at the input of the modulator/PET distorter 104 to the $TX_{IN}$ signal. By performing modulation after the PA 102, the PA 102 can be tuned for peak efficiency and power without generating distortion in the PA 102. Since DRFM spreads the signal after the PA 102, the PA 102 operates at a much lower PAPR and the signal bandwidth is introduced after the PA. FIG. 1C shows that application of digital PET according to the present invention provides a beneficial purely digital approach of spectral shaping, as described next.

A preferred embodiment PET method generates the transitions and provides a purely digital approach to spectral shaping. At each transition of the modulating waveform, x(t), one or more extra pulse transitions, $p_n(t)$, are added to emulate a smooth transition similar to a band-limited signal by synthesizing an ideal band-limited signal, such as raised cosine. The modulated waveform, y(t), is binary in nature but is represented as the product of x(t) and a set of pulses of width Δtn, centered at the original edges of x(t). Thus, $$y(t) = x(t) \cdot \prod_{n=1}^{n} p_n(t) \quad (1)$$

The choice of the number of additional transitions, N, is limited by the available switching bandwidth, and is discussed separately below.

Periodic Modulation

To understand the construction of $p_n(t)$, initial considerations are limited to periodic forms for x(t) and in the base case, a square wave such as for a local oscillator driving a mixer. For N=1, (1) reduces to $$y(t) = x(t) \cdot p_1(t) \quad (2)$$

Where y(t), x(t), and $p_1(t)$ are plotted in FIGS. 2A, 2B and 2C respectively. Since x(t) is periodic, the composite signal, y(t), can also be written as a Fourier series.

$$y(t) = \sum_{k=-K}^{K} a_k \cdot e^{j\frac{2\pi k t}{T}} \quad (3)$$

Solving for the he Fourier coefficients, $a_k$, gives $$a_k = \frac{2}{\pi k} \sin\left(\frac{2\pi k T_1}{T}\right)\left[-1 + 2\cos\left(\frac{\pi k \Delta t_1}{T}\right)\right] \quad (4)$$

where T is integration period, and $T_1$ is half the total pulsewidth of x(t). Inspection shows that this solution can be decomposed into important components, $a_k = b_k \cdot c_k$, where $b_k$ is the Fourier coefficients of x(t), i.e. a square wave, and $c_k$ is the coefficients of $p_1(t)$ convolved with x(t). Since $c_k$ depends on $\Delta t_1$, it becomes clear that for a given k, a specific value for $\Delta t_1$ can be found such that $c_k$, and, therefore $a_k$, can be reduced to zero. For example, the solution for k=3 can easily be found analytically as $\Delta t_1 = T/9$ and the third harmonic is eliminated. This solution does not depend on x(t), i.e. $T_1$, and therefore the method can be applied to any random digital modulation.

Extending the analysis to values of N>1 gives (5) for $a_k$. This result yields N values of $\Delta t_n$ that can be solved with N equations. Consequently, for every pulse added to each transition, another harmonic can be set to zero and cancelled. In the case of (5), $$a_k = \frac{2}{\pi k}\sin\left(\frac{2\pi k T_1}{T}\right)\left[(-1)^N + 2\sum_{n=1}^{N}(-1)^{N-n}\cos\left(\frac{\pi k \Delta t_n}{T}\right)\right] \quad (5)$$

there does not appear to be analytic solutions for values of N>1, however solving them numerically is not difficult given the constraints.

$$\Delta t_n < \Delta t_{n+1} > 2T_1. \qquad (6)$$

These constraints ensure that the solutions do not result in any wrapping errors that might occur when performing the integration used to find (5).

Figures 3A, 3B, 3C:
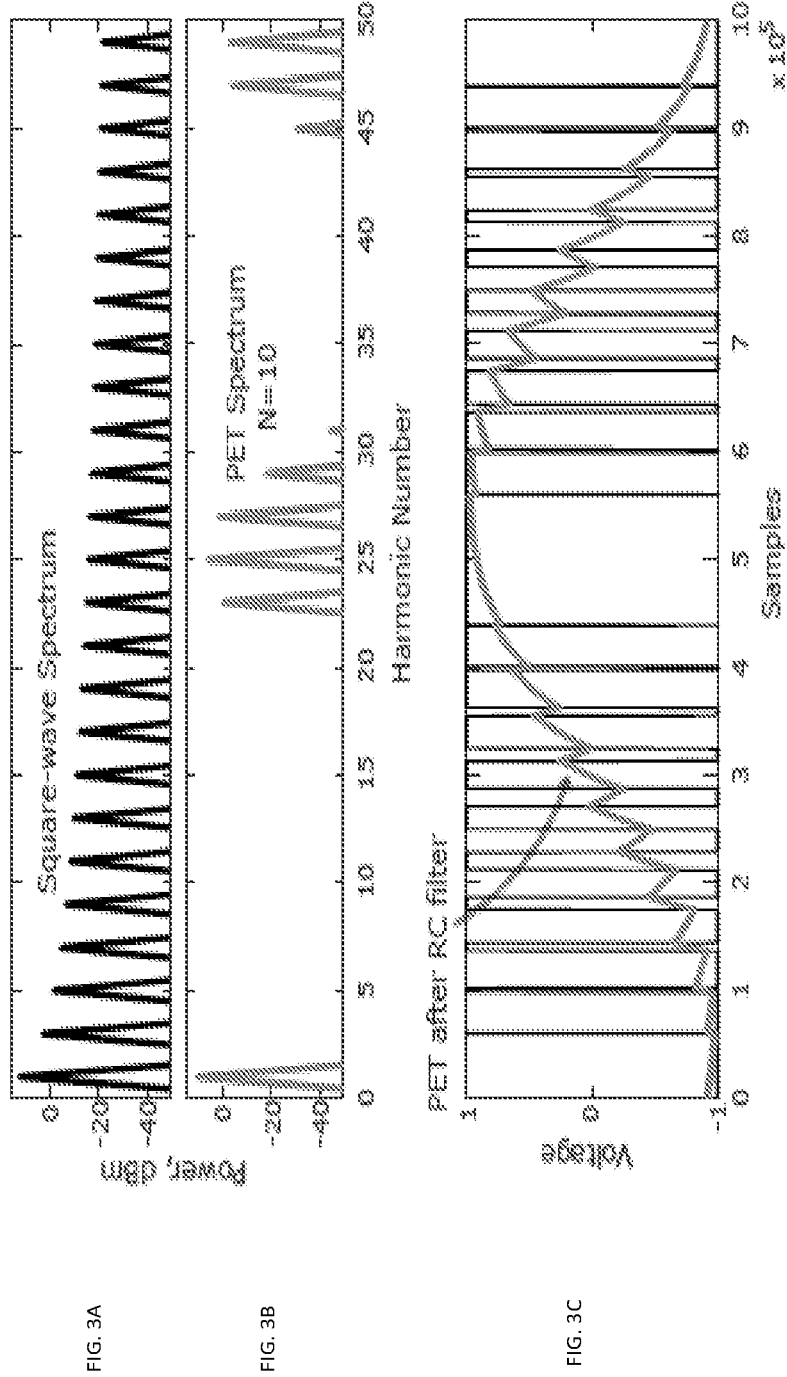
FIGS. 3A and 3B show an original square-wave spectrum compared to a spectrum using PET of a preferred method.
FIG. 3C shows the time domain of unfiltered and RC filtered PET signal when N=10 and the RC time constant is 5% of the period, T.

FIG. 3A compares the spectrum for a square wave x(t) and corresponding PET spectrum of y(t) when N=10 for which the odd harmonics, 3-21, are canceled. While the harmonics are eliminated, some of the aliased energy has been moved to higher frequencies where it can be more easily filtered. When the PET signal is passed through a first-order filter, as in the case of the RC-limited switch, the resulting filtered version of y(t) is shown in FIG. 3B. As the high-frequency content is filtered, the PET waveform converges to a sinusoidal signal, as seen in FIG. 3C.

Figure 4:
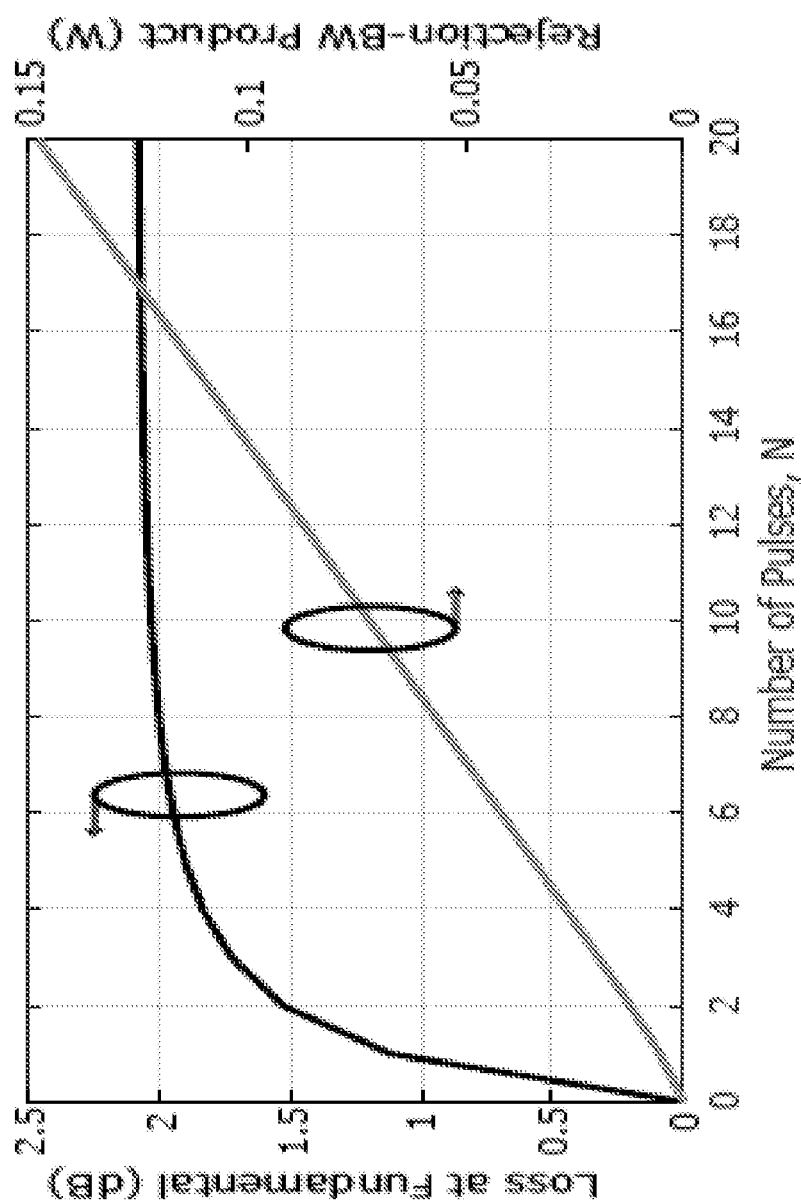
FIG. 4 shows the fundamental IL and CBW product as a function of increasing number of pulses.

FIG. 3B also highlights one limitation of any pulsewidth modulation (PWM) approximation of band-limited signals in which the maximum amplitude of the fundamental frequency is limited to the amplitude of the digital signal. When removing the high-order harmonic content through ideal raised cosine filtering, the fundamental amplitude is 4/n times the amplitude of the square wave. Therefore, the PET technique introduces an IL as a function of the number of canceled harmonics in FIG. 4. For a large N value, the IL converges to 2.1 dB; however, this loss also comes with an increased total cancellation as N increases. FIG. 4 also plots the CBW product defined by:

$$CBW = (2N+1) \sum_{n=1}^{N} (HD_{2n+1,o} - HD_{2n+1,c}) \qquad (7)$$

where $HD_{2n+1}$ is the HD defined by the ratio of the power in the 2n+1 harmonic relative to the fundamental and the subscript o denotes the original HD, while c denotes the canceled HD. The bandwidth is normalized to the fundamental frequency. For example, when N=1, $HD_{3,o}$ is 1/9 and is eliminated, i.e., $HD_{3,c}=0$. Then, CBW=10 $\log_{10}(3 \cdot (1/9-0))$ =−4.77 dB, which is the result shown when N=1 in FIG. 4. Alternatively, multiple harmonics can be canceled partially for N=1 or N can be increased to cancel more harmonics completely. The effectiveness of the digital PET method for real DRFM switches can be evaluated by measuring this CBW and comparing it to the ideal curve, which is considered further below.

The PET technique effectively introduces an IL as a function of the number of cancelled harmonics in FIG. 4, which shows loss of power at the fundamental vs. increasing number of cancelled harmonics. For a large N, the IL converges to 2.1 dB, however this loss also comes with an increased total rejection BW as the number of pulses increases. FIG. 4 also gives the rejection-BW product for increasing number of cancelled harmonics. Since most of the energy is contained in the first few harmonics of the square wave, this results in a nearly linear relationship to the number of pulses used. In this case, the rejection-BW product is plotted in linear units of Watts since the logarithmic rejection is theoretically infinite.

Random Modulation

The previous analysis considered the case where x(t) is periodic, i.e. a square-wave. More generally, it is important to consider random modulation and the impact of PET filtering on the resulting power spectrum. Solutions for Δtn do not depend on the duty cycle, or pulse width of x(t). Therefore, arbitrary modulation can be decomposed into individual pulses and hence the case where $T_1$ does not equal T/4 may be addressed. Additionally, since the Fourier transform is a linear operation, the addition of the pulses in the time domain also leads to the addition of the pulses in frequency domain (with the exception of the DC component which in this case is not important). The power spectral density (PSD) of the modulated signal then becomes $$S_{yy}(f) = S_{xx}(f) \left\| (-1)^N + 2\sum_{n=1}^{N} (-1)^{N-n} \cos\left(\frac{\pi f \Delta t_n}{T}\right) \right\|^2 \qquad (8)$$

Figure 5:
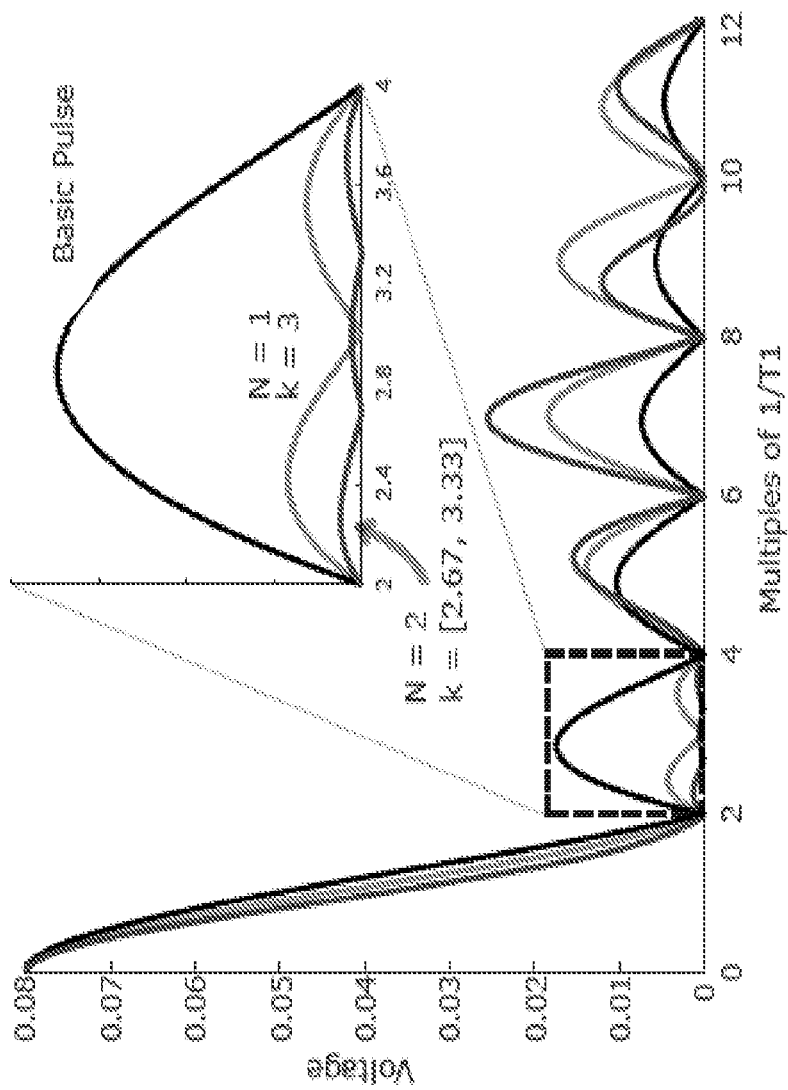
FIG. 5 shows the spectrum of a single pulse when N=1 and k=3, i.e., $\Delta_{t1}=\frac{1}{9}$. $4T_1$ and when N=2, $k_1=8/3$, and $k_2=10/3$.

The PSD of x(t) is $S_{xx}$ and follows a $\text{sinc}^2(f)$ function, as highlighted in FIG. 5 with nulls occurring at multiples of $1/(2T_1)$, the pulse width. However, when the same solutions for $\Delta t_n$ in $p_n(t)$ are scaled to the pulsewidth, they still cancel energy at the kth harmonic as if the integration period were scaled to the pulse width, i.e. $T=4T_1$ which is equivalent to enforcing (6) for a narrower pulse. This is demonstrated for N=1 and k=3 in FIG. 5 where the x-axis is normalized to $1/T_1$, so that the indices of the $k^{th}$ harmonic align correctly (solving for k=3 results in a notch at 3 on the x-axis). What remains are two smaller lobes on either side of the $k^{th}$ harmonic that are significantly reduced in magnitude, but still present.

To eliminate these remaining lobes, (5) can be solved for non-integer values of k. This yields cancellation at any desired location in the spectrum which is shown in FIG. 5 where N=2, $k_1=8/3$, and $k_2=10/3$. As such, an increasing number of pulses N can be added to an arbitrary signal that will reduce harmonic content over a specified bandwidth.

Figure 6:
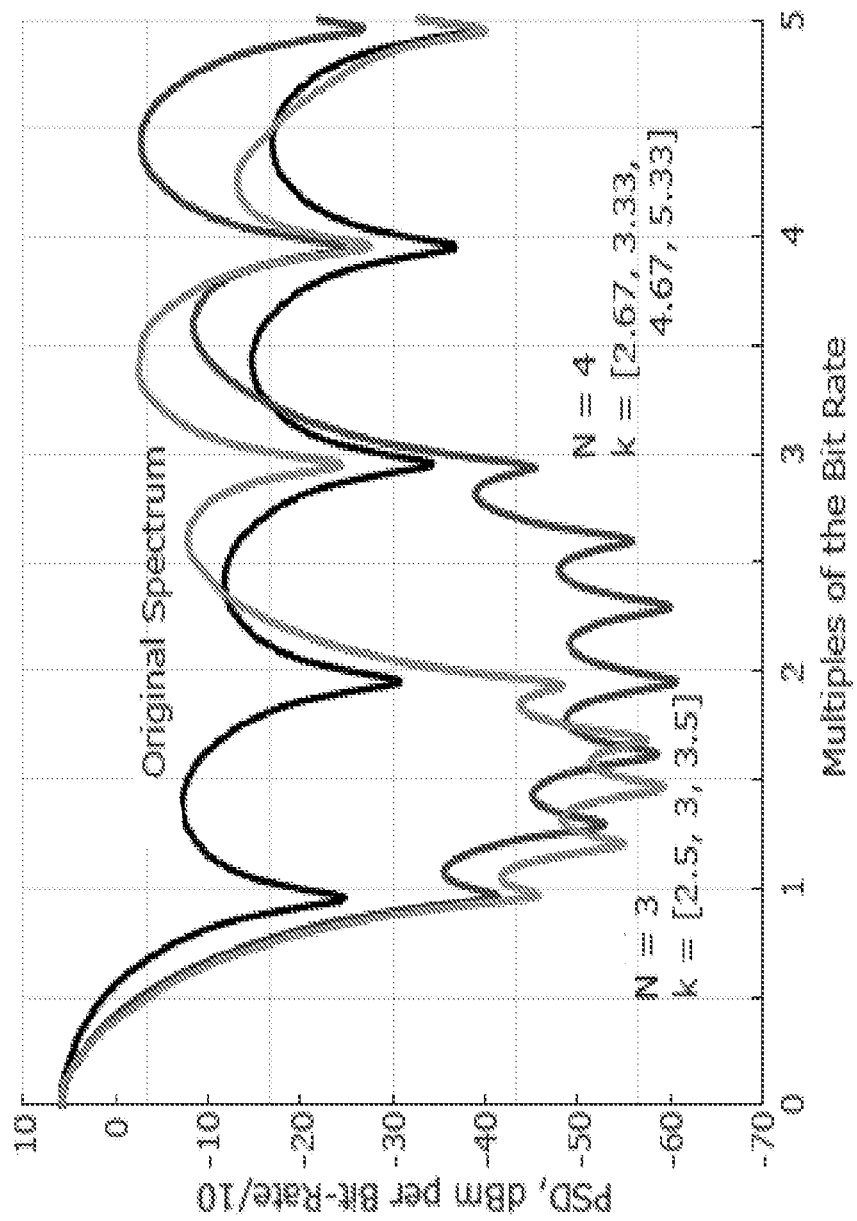
FIG. 6 shows the spectrum for random BPSK data with cancellation of the first lobe with N=3, and cancellation of the first two lobes with N=4.

FIG. 6 compares the resulting PSD for a random PET signal, y(t), when using different solutions for different values of N and an averaging filter with a resolution bandwidth equal to 1/10 of the sample rate to smooth the spectrum. For N=3, the PSD is filtered for one adjacent channel, i.e. between 1 and 2 times the bit rate, while for N=4, the filtering extends over two adjacent channels, i.e. between 1 and 3 times the bit rate. Different locations for k enable a variety of notch depths and CBWs in the modulated signal. While the example used BPSK, the digital PET method of the invention is generally application to any higher order digital modulation technique, e.g., QPSK, PWM, etc.

Since digital PET does not rely on the width or amplitude of each data point/pulse, applying digital PET to amplitude-modulated I/Q streams is effective at reducing the adjacent channel emissions. If the I and Q channels are independently modulated using digital PET, the composite QAM waveform will alternate between the subsequent symbols rather than simply between −1 and 1 to generate the band-limited symbol. In such a case, the solutions found through (5) are still valid. Therefore, if a DRFM system is capable of generating a constellation, it will also be capable of utilizing digital PET waveforms to reduce OOB emissions.

Figure 7:
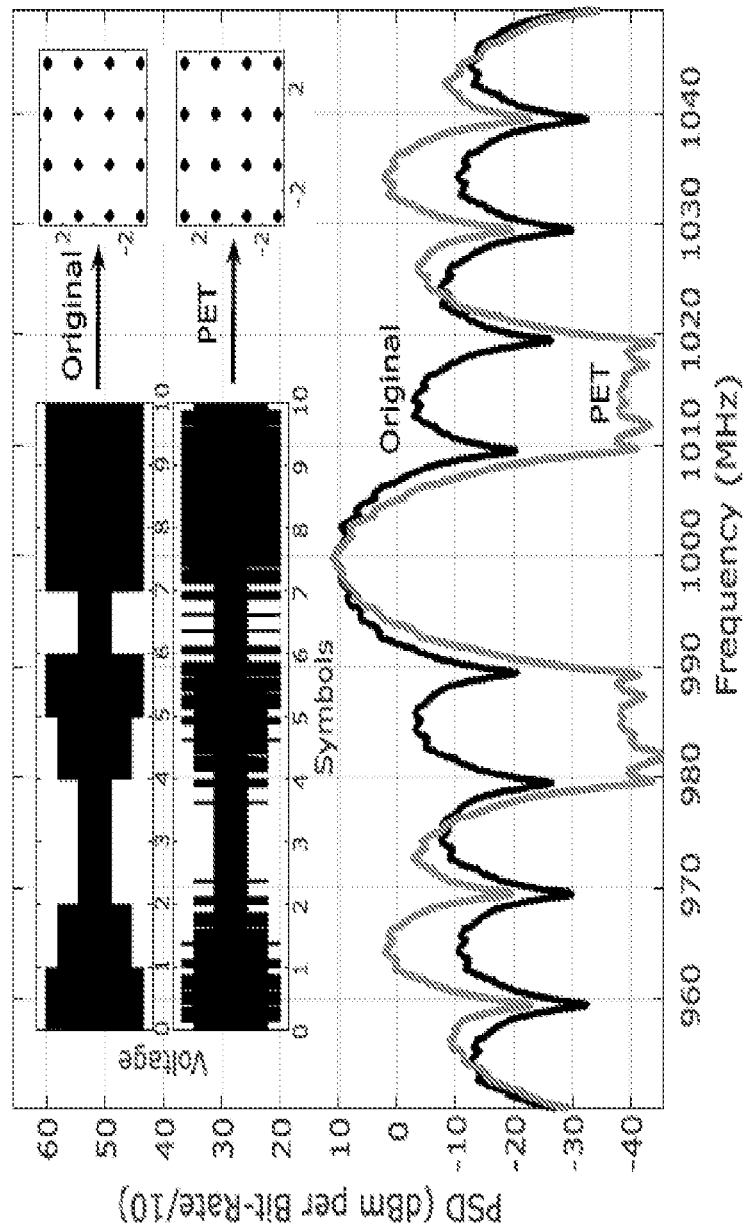
FIG. 7 shows simulated spectrum for a 16-QAM signal comparing the original spectrum to the PET spectrum and corresponding time-domain waveforms and their received constellations.

FIG. 7 plots digital PET on a 16-QAM signal, highlighting the spectrum showing close to −50-dB ACLR, as well as the resulting time-domain wave-forms and the corresponding received constellations. While the preferred embodiments discussed as an example focus on BPSK implementations of digital PET, various forms of DRFM transmitters can use digital PET waveforms for higher order modulation. Example DRFM transmitters that can benefit are provided in the following publications. S. Shopov, N. Cahoon, and S. P. Voinigescu, "Ultra-broadband I/Q RF-DAC transmitters," IEEE Trans. Microw. Theory Techn., vol. 65, no. 12, pp.

5411-5421, December 2017; B. Yang, E. Y. Chang, A. M. Niknejad, B. Nikoli'c, and E. Alon, "A 65-nm CMOS I/Q RF power DAC with 24-to 42-dB third-harmonic cancellation and up to 18-dB mixed-signal filtering," IEEE J. Solid-State Circuits, vol. 53, no. 4, pp. 1127-1138, April 2018; R. Bhat and H. Krishnaswamy, "A watt-level 2.4 GHz RF I/Q power DAC transmitter with integrated mixed-domain FIR filtering of quantization noise in 65 nm CMOS," in Proc. IEEE Radio Freq. Integr. Circuits Symp., June 2014, pp. 413-416. In these examples, the digital PET waveforms can enable the use of lower resolution DACs through increased sampling rates.

Comparison to Σ-Δ Modulation for RF Transmitters.

Figure 8:
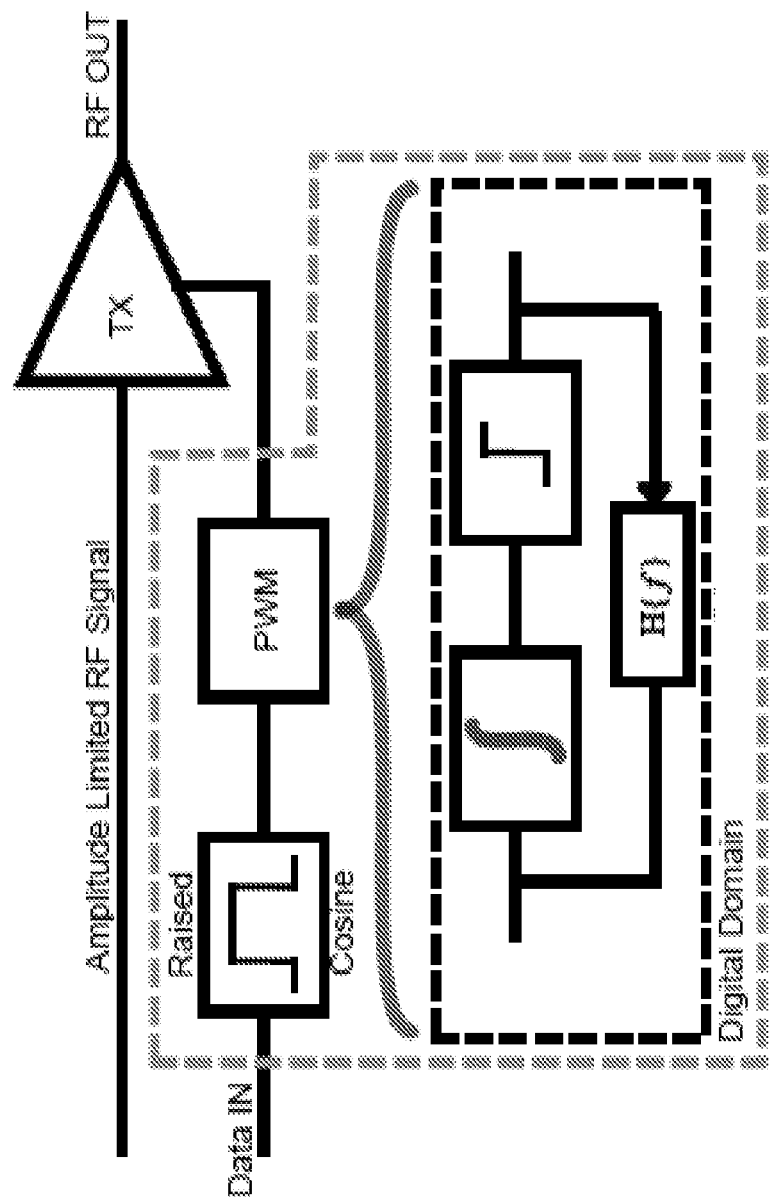
FIG. 8 (PRIOR ART) is a block diagram of a PWM direct modulation transmitter chain with a diagram of a ΣΔM.

FIG. 8 shows a conventional PWM direct modulation transmitter chain, and block diagram of a conventional Σ-Δ Modulation. FIG. 8 represents the conventional approach to filtering aliases produced by DRFM is pulse-width modulation (PWM) to emulate a band-limited signal. As illustrated in FIG. 8, the input signal is passed through a raised cosine filter, then converted to a PWM signal with constant envelope to generate a pulse stream that reconstructs the desired transmitter signal. See, M. Jeon, J. Woo, S. Park, and Y. Kwon, "A pulsed dynamic load modulation technique for high-efficiency linear transmitters," IEEE Trans. on Microw. Theory and Techn., vol. 63, no. 9, pp. 2854-2866, September 2015; J. Jeong and Y. E. Wang, "Pulsed load modulation (PLM) technique for efficient power amplification," IEEE Trans. on Circuits and Sys. II: Express Briefs, vol. 55, no. 10, pp. 1011-1015, October 2008. These approaches use simple PWM encoding schemes with a complex filter, which leads to high OOB quantization noise and spurious harmonics due to the required comparison waveforms.

Figure 9:
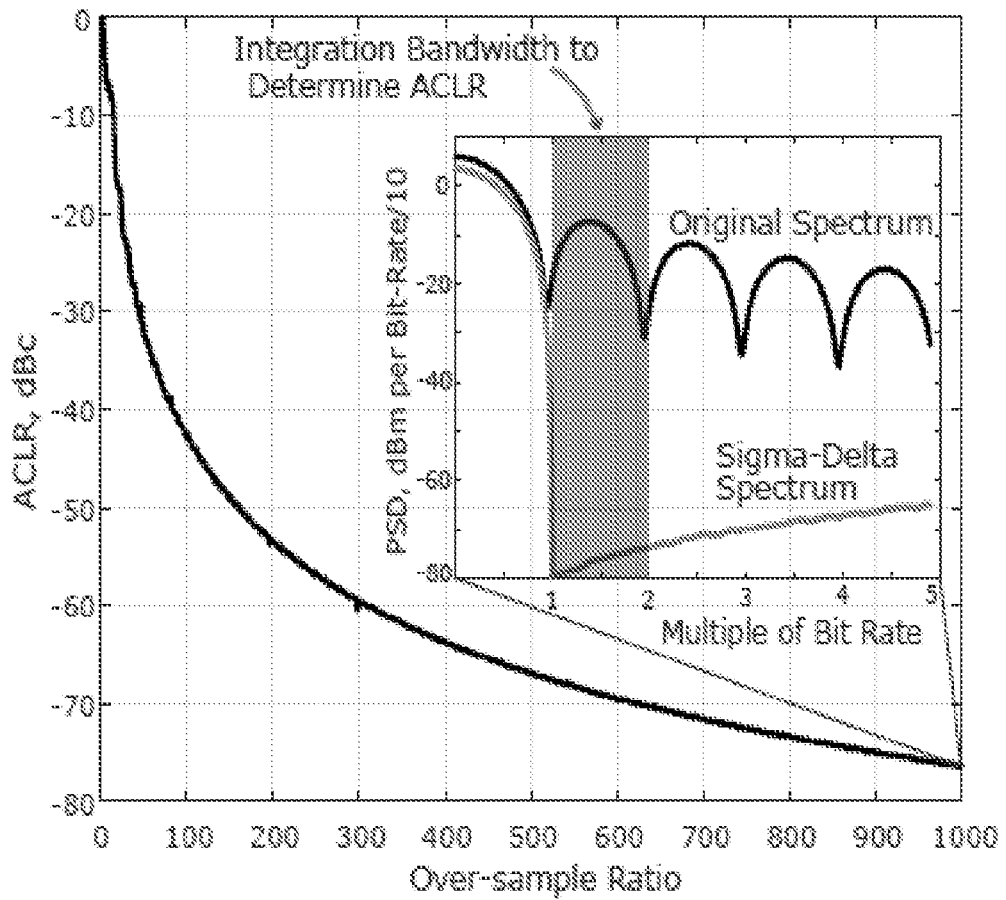
FIG. 9 illustrates ACLR rejection using the first- and second-order ΣΔM for increasing OSR with a sample spectrum provided to show the spectrum of the ΣΔM at an OSR of 1000.

ΣΔM techniques to generate PWM signals as also shown in FIG. 8 can be used to shape the noise near the TX band. See, A. Jayaraman, P. F. Chen, G. Hanington, L. Larson, and P. Asbeck, "Linear high-efficiency microwave power amplifiers using bandpass delta-sigma modulators," IEEE Microw. and Guided Wave Lett., vol. 8, no. 3, pp. 121-123, March 1998. That approach uses ΣΔM to emulate the entire RF carrier and envelope at the cost of an excessively high sample rate. Other approaches improve on this architecture by only applying the ΣΔM to the envelope of the RF signal. Y. E. Wang, "An improved kahn transmitter architecture based on delta-sigma modulation," in IEEE/MTT-S Int. Microw. Symp. Dig., vol. 2, June 2003, pp. 1327-1330 vol. 2; A. Dupuy and Y. E. Wang, "High efficiency power transmitter based on envelope delta-sigma modulation (EDSM)," in IEEE 60th Vehicular Tech. Conf., 2004. VTC2004-Fall. 2004, vol. 3, September 2004, pp. 2092-2095 Vol. 3. Other approaches present up to −50-dBc noise cancellation techniques for RF ΣΔ transmitters at low OSRs, but in doing so, reintroduce minor amplitude modulation and additional computational complexity, making these techniques unsuitable for DRFM. See, U. Gustavsson, T. Eriksson, and C. Fager, "A general method for pass-band quantization noise suppression in pulsed transmitter architectures," in IEEE/MTT-S Int. Microw. Symp. Dig., June 2009, pp. 1529-1532; M. M. Ebrahimi and M. Helaoui, "Reducing quantization noise to boost efficiency and signal bandwidth in deltasigma-based transmitters," IEEE Trans. on Microw. Theory and Techn., vol. 61, no. 12, pp. 4245-4251, December 2013. FIG. 9 shows ACLR rejection using first-order ΣΔM for increasing OSR. To provide an ACLR of at least 50 dB demands an OSR of 200 or above. The high OSR places significant demands on not only the digital power consumption, but also the tolerated switching speed of the RF modulator when using wideband signals. FIG. 9 shows adjacent channel leakage reduction for increasing number of pulses at frequencies that are between 1 and 2 times the modulation rate as a function of the decimal precision of $A_t$, relative to the width of the symbol The digital PET waveform generated by preferred methods is limited by two factors in any DRFM transmitter. First, the minimum pulse-width will determine the required switching speed (RF OSR) of any power modulator at the antenna. Second, the decimal precision of the generated pulse-widths required to provide rejection will determine the required clock rate (digital OSR) of the digital output, or the speed of any hardwired circuits that might be used to generate these pulses. These represent the RF and digital switching speed bottlenecks respectively. Both bottlenecks can be compared to the OSR of the ΣΔM as the minimum switching interval will always be related to the digital clock speed.

Figure 10:
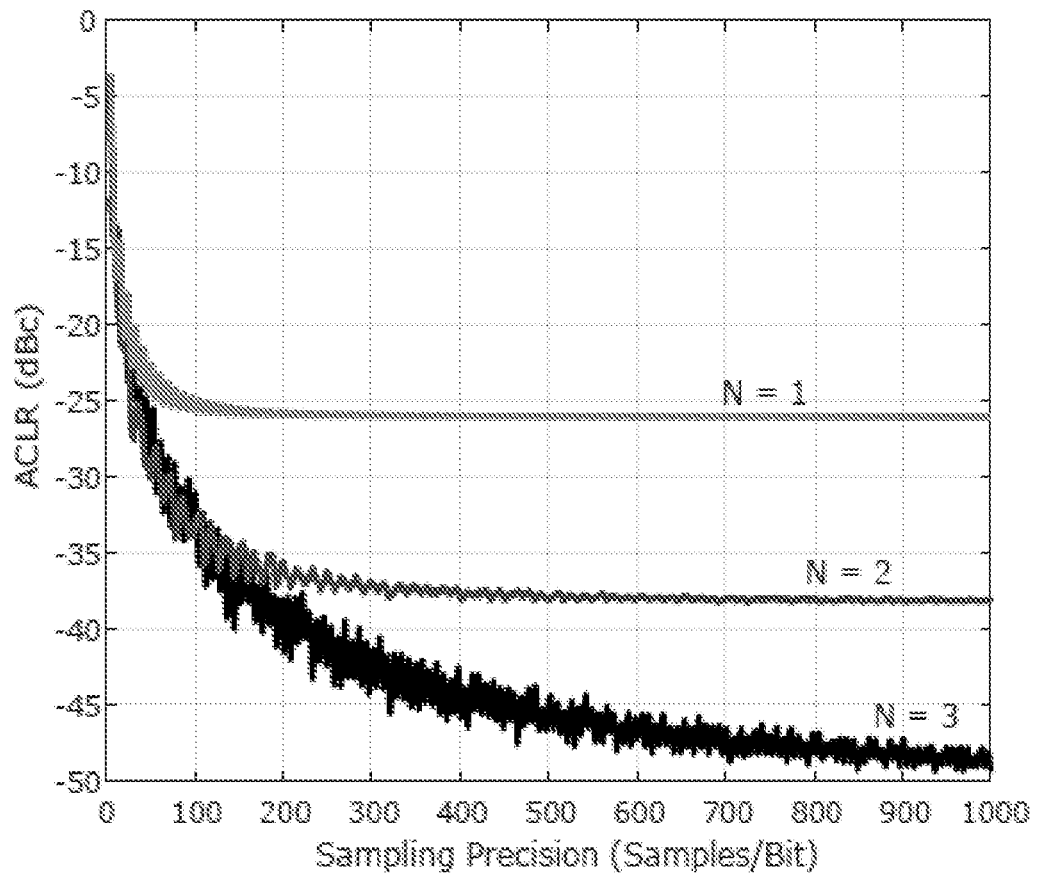
FIG. 10 illustrates adjacent channel leakage reduction for an increasing number of pulses as a function of the digital OSR for the PET waveforms.

FIG. 10 shows how the precision of the generated pulses effects the rejection for different values of N. The trends at higher values of N are similar to that required by ΣΔMs, and therefore indicate that the required digital clock speed is similar. The benefit of the digital PET waveform is clear in Table I which compares the minimum required pulse-width, and therefore the effective OSR of the digit PET method to the OSR of ΣΔM which gives equal ACLR. For each calculated value of N, the effective OSR of the digital PET waveform is a factor of 2-3 lower than that of ΣΔM which implies significantly better ACLR or better bandwidth of operation for DRFM transmitters. The benefit of the present PET method is clear in Table I, which compares the ACLR of PET and ΣΔM using the minimum PET RF OSR as a reference sampling rate that can be determined from (9). For each case, the simulated ACLR is in the range of 10-15 dB lower when using PET than when using ΣΔM at the same RF OSR:

$$RF\ OSR = \frac{4T_1}{\min(\Delta t_{n+1} - \Delta t_n)}. \quad (9)$$

TABLE I

Comparison of ACLR using PET and ΣΔM At Specified RF OSR Values

| | | Simulated ACLR (dBc) | | | | |
| --- | --- | --- | --- | --- | --- | --- |
| | | PET N | | | ΣΔM order | |
| PET N | RF OSR | 1 | 2 | 3 | 1 | 2 |
| 1 | 18 | 25.8 | | | 16.1 | 10.7 |
| 2 | 32 | | 38.0 | | 25.5 | 25.9 |
| 3 | 58 | | | 49.1 | 34.4 | 39.2 |

High-Power, High Switching Speed RF Modulation.

Aside from ACLR, another issue for DRFM techniques is the need for high power, high bandwidth switches available in low-cost CMOS processes. Previous high power DRFM switches make use of back-to-back differential baluns to perform modulation. See, C. Hill, C. S. Levy, H. AlShammary, A. Hamza, and J. F. Buckwalter, "RF watt-level low-insertion-loss high-bandwidth SOI CMOS switches," IEEE Trans. on Microw. Theory and Techn., vol. 66, no. 12, pp. 5724-5736, December 2018. While the switches allow for low loss, the baluns add an additional loss of up to 1.6 dB that make the circuits impractical for use after the PA.

Figures 11A, 11B, 11C, 11D:
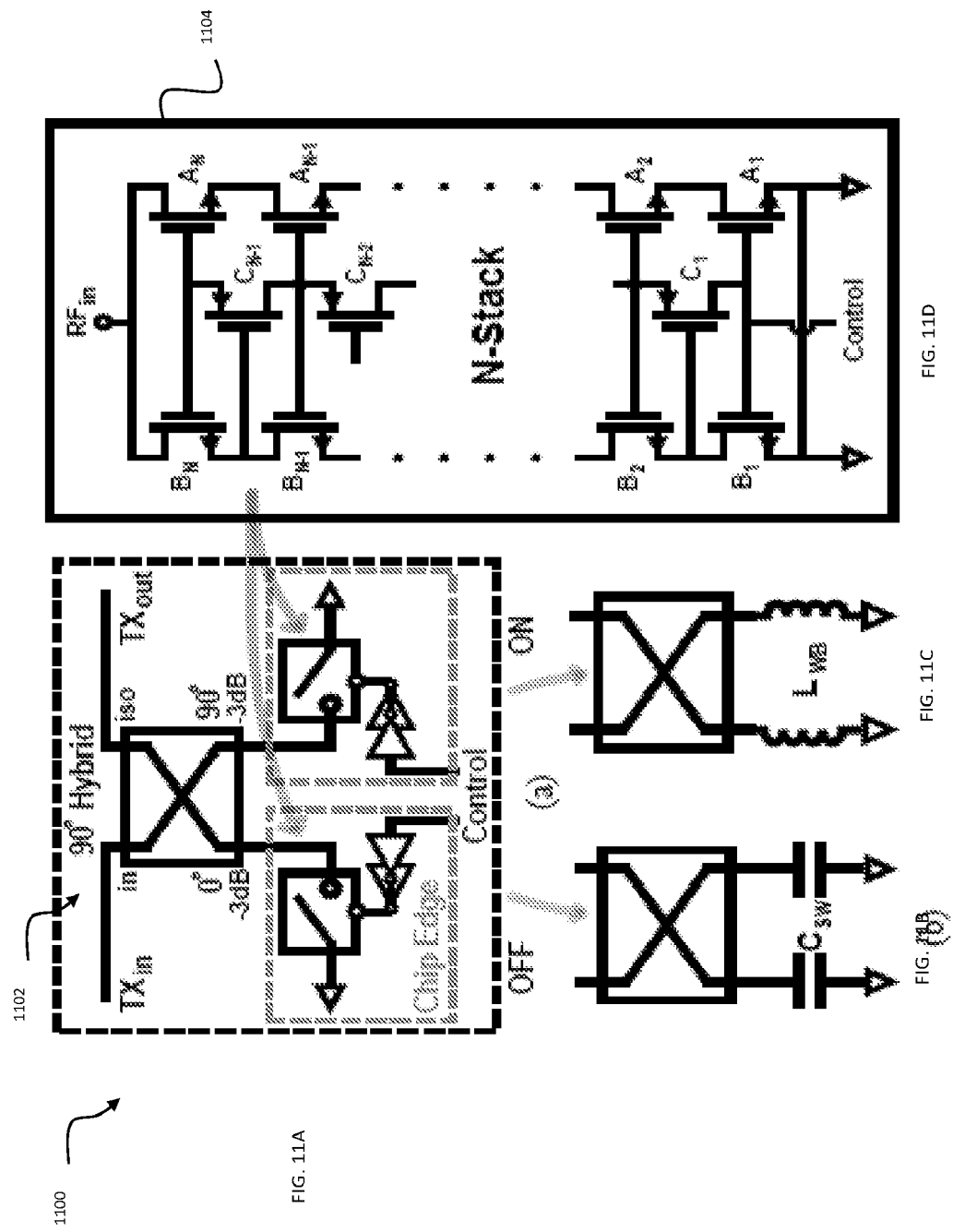
FIGS. 11A-11D respectively show a schematic of an RPS modulator, equivalent circuit when switches are open, equivalent circuit when switches are closed, and a schematic of stacked-FET switches for high-power, high-bandwidth modulation.

FIGS. 11A-11D illustrate a preferred embodiment circuit 1100 that uses a hybrid coupler 1102 as a reflection-based phase shifter (RPS) to perform BPSK modulation. The control signal in FIGS. 11A-11D is the DRFM signal, e.g. the sigma-delta output, PET waveforms, etc. FIGS. 11A-11D provide a preferred architecture to implement DRFM with PET in a transmitter. Hybrid couplers with a loss of <0.2 dB are readily available and therefore the RPS design offers significant improvements in overall loss compared to those using back-to-back baluns. The principle of operation for the RPS is to modulate the load seen by the through and coupled ports of the hybrid coupler 1102. The reflections at these ports cancel at the input port and add constructively at the isolated port of the coupler, respectively. By changing the phase of the reflection coefficient, the relative change in phase is imparted on the added signal at the isolated port, creating a phase shift. For 2-state phase modulation, i.e. BPSK, only two reflection coefficients are needed, $\Gamma=1$ and $\Gamma=-1$. An RF switch can be opened and closed at each output of the coupler to create either a 0° or 180° degree phase shift as shown in FIG. 11A.

When the switches are OFF, the reflection is ideally open, e.g. $\Gamma=1$. However, the switch contributes some parasitic capacitance, labeled $C_{SW}$, to ground. The equivalent schematic is shown in FIG. 11B. Consequently, the reflection coefficient is $$\Gamma_{OFF} = \frac{1 - j\omega C_{SW} Z_o}{1 + j\omega C_{SW} Z_o}. \quad (10)$$

When the switches are ON, the reflection is ideally shorted, e.g. $\Gamma=-1$. Due to the inductance contributed by the wirebonds, $L_{WB}$, between the signal path and the switch and between the PCB and chip grounds as in FIG. 10C, and the reflection coefficient is:

$$\Gamma_{ON} = \frac{j\omega L_{WB}/Z_o - 1}{j\omega L_{WB}/Z_o + 1}. \quad (11)$$

While the effect of $C_{SW}$ and $L_{WB}$ would be detrimental to generating the precise reflection coefficient, the phase shift remains 1800 when $C_{SW}$ and $L_{WB}$ present equal impedance. Adding additional switches and passives can generate any desired phase shift, which enables higher order modulation and implementation of the present PET method.

Using an RPS approach does add some additional challenges in switch design. Because the incident wave is reflected off of $\Gamma=1$ when the switch is open, the peak voltage seen at the input of the switch is doubled. Since the hybrid coupler divides the power equally between the two ports, the incident voltage on the switches is equal to $2/\sqrt{2} \cdot V_{TXin}$.

To handle the high voltage while maintaining high bandwidth, a stacked-FET switch 1104 is preferably. This design allows high power handling in the OFF state by using the secondary switches, labeled B and C, to present a high impedance to the gate of the primary switches, labeled A. This allows the gate node of A to swing with its drain and source nodes to prevent voltage breakdown. Additionally, this design enables high bandwidth by allowing charge to flow quickly through the switch as the cascade of devices turn on consecutively, merging the C devices into one control node.

Previous versions of this type of stacked switch demonstrate power handling of 30 dBm and higher but were aided by external components such as capacitors and baluns to reduce the incident voltages on the devices. See, C. Hill, C. S. Levy, H. AlShammary, A. Hamza, and J. F. Buckwalter, "RF watt-level low-insertion-loss high-bandwidth SOI CMOS switches," IEEE Trans. on Microw. Theory and Techn., vol. 66, no. 12, pp. 5724-5736, December 2018; C. S. Levy, P. M. Asbeck, and J. F. Buckwalter, "A CMOS SOI stacked shunt switch with sub-500 ps time constant and 19-Vpp breakdown," in IEEE Compound Semiconductor Integr. Circuit Symp., October 2013, pp. 1-4. To significantly improve the voltage handling of these types of switches, a tapering approach to the secondary switches (B and C) is preferred and provide by the present invention.

Typically, power handling is limited by self-conduction when the switch is OFF. This is caused by the drain of $A_1$ swinging, while the gate of the device is connected to the dc-grounded control line. In order to prevent the bottommost devices from conducting in the OFF state, the voltage swing at the drain of $A_1$ must be less than the threshold of the device. In addition, if the voltage drop across each transistor is to be approximately the same, the voltage division from the drain to the gate of each consecutive device must be a smaller fraction of the total remaining incident voltage. This means that the bottom secondary devices ($B_1$ and $C_1$) must be the largest and the top secondary devices ($B_M$ and $C_{M-1}$) must be the smallest, while the size of the primary devices ($A_1 \to A_M$) remains the same to ensure the highest voltage handling. Conversely, adding stacks with increasingly aggressive tapers has a significant impact on the achievable FBW. To describe this tradeoff, a tapering function can be defined as $$B_M = C_M = \frac{A_M}{M^x} \quad (12)$$

with $A_M$, $B_M$, and $C_M$ representing the size of the $M^{th}$ device in the respective stacks as labeled in FIG. 11D and x representing the tapering factor.

Figure 12:
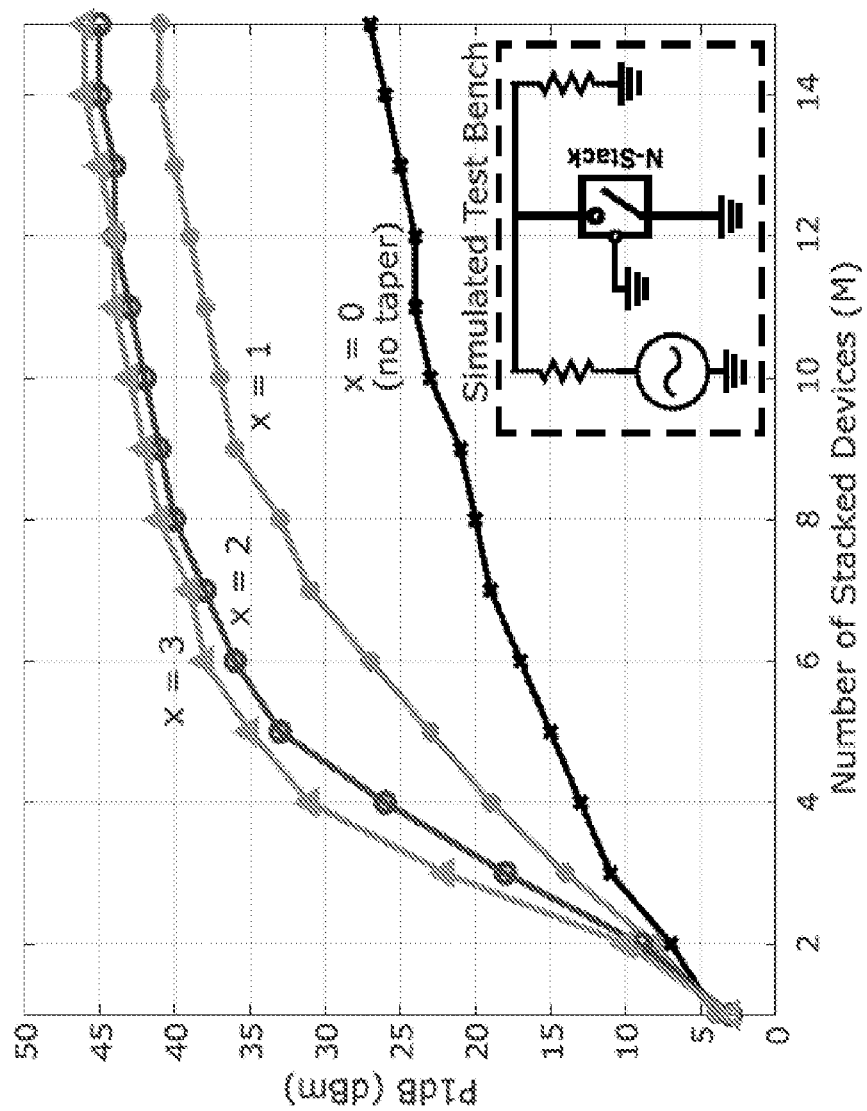
FIG. 12 illustrates the effect of device stacking and tapered switch sizing for different tapering factors, x, on switch power handling.

FIG. 12 shows the simulated $P_{1dB}$ of tapered stacked shunt switches with different numbers of stacked devices and increasingly aggressive device tapering factors. To maintain a constant switch resistance, the size of the primary devices A is scaled linearly with the number of stacked devices. Adding a taper to the switch, x=1, the power handling of the shunt switch is improved by 15-20 dB over a switch with uniform sizing, x=0. Using more aggressive tapering, e.g., x=2, further increases $P_{1dB}$, but additional tapering provides limited benefits.

Figure 13:
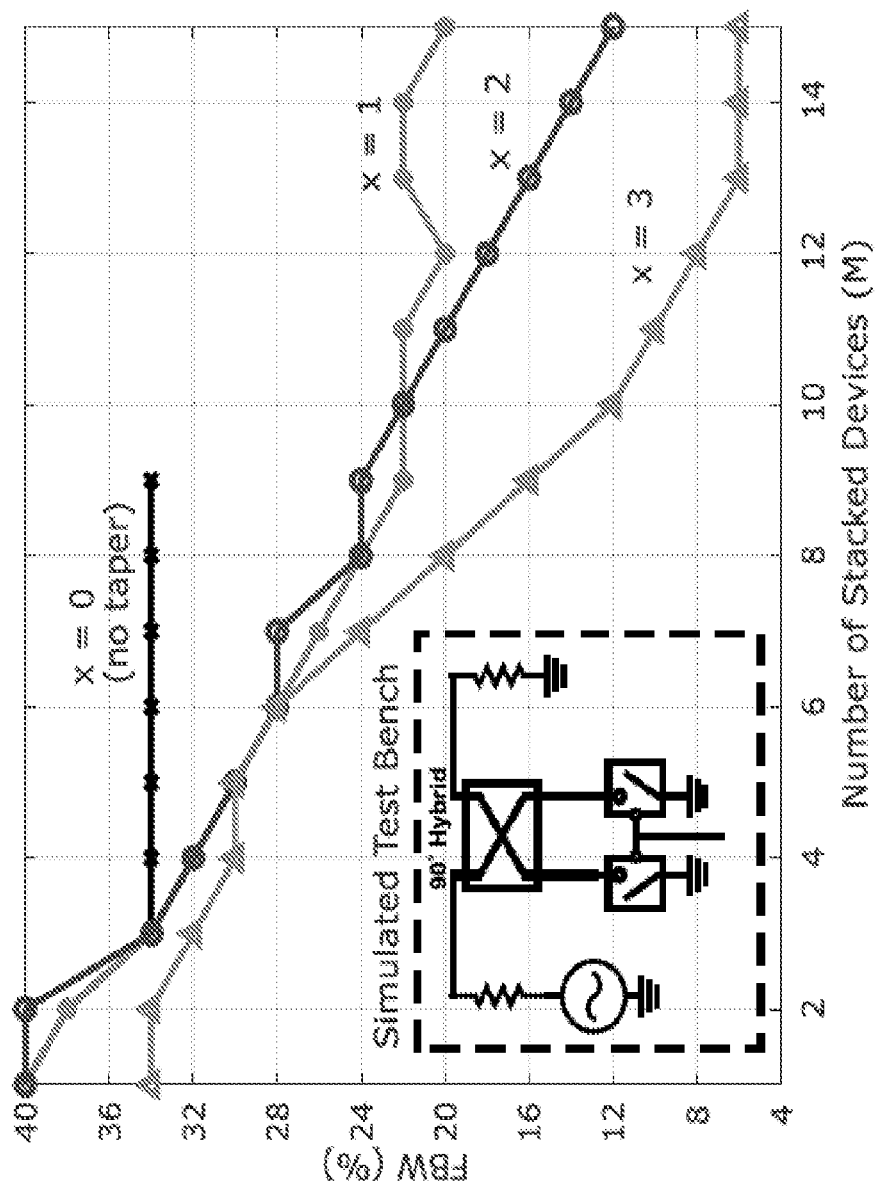
FIG. 13 illustrates the effect of device stacking and tapered switch sizing for different tapering factors, x, on a maximum achievable FBW.

Conversely, increasing the number of stacks adds both additional gate capacitance, due to more devices in the stack and larger devices to keep the switch resistance low, and series resistance in the control line, which also increases with the tapering factor. As a result, the switching speed is reduced. To quantify the tradeoff in the additional gate capacitance, the FBW is plotted in FIG. 13 for increasing stacks and tapering factors. In this case, the maximum FBW is defined as the switching frequency at which the losses increase by 1 dB. Without a taper in device sizing (x=0), increasing the number of stacked devices beyond 9 requires very large devices to maintain low switch resistance, which results in a low input impedance in the OFF state due to $C_{SW}$ and modulation becomes impossible in the RPS test bench shown in FIG. 13. Adding the tapering function allows modulation at high values of M and thus higher power handling concurrent with modulation. From FIGS. 12 and 13, the design tradeoffs between power handling and FBW are clear—larger M leads to more power handling but lower maximum FBW. Ultimately, using the same tapering factor in both the B and C devices is not ideal as it is better to have larger C devices to keep the series resistance down for higher FBW.

Figure 14B:
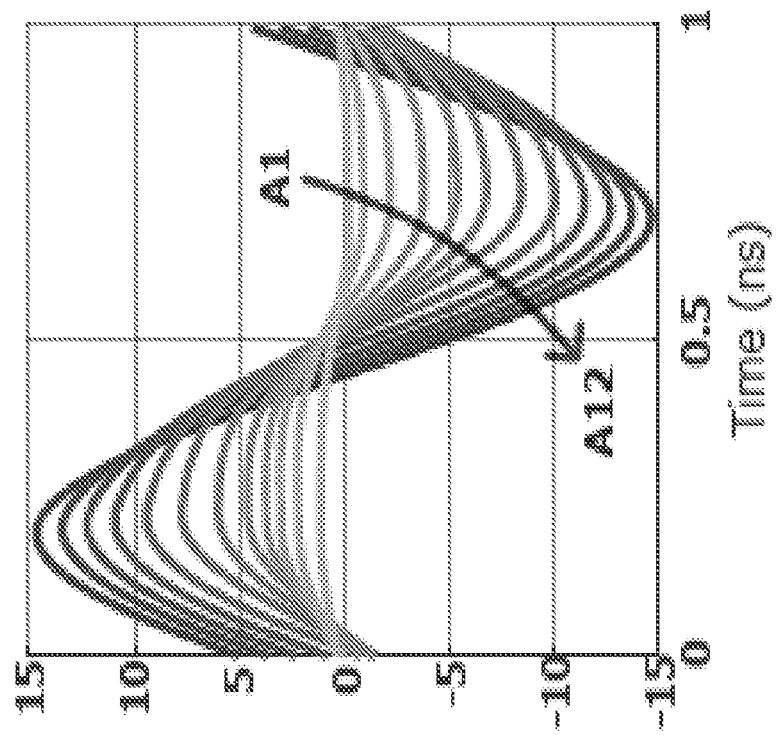
FIGS. 14A and 14B respectively show drain voltages of the primary A switching transistors for the FIG. 12 RPS in the OFF state with a 30-dBm input when the stacked switches are sized with static sizing and with tapering.
Figure 14A:
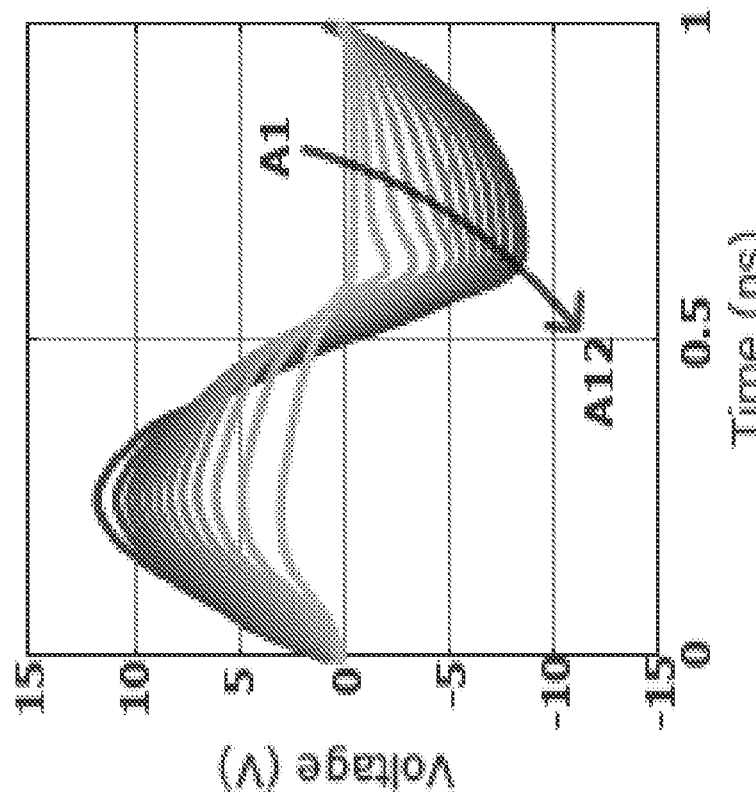

For prototype switches, versions of the switch with different choices of M are compared, M=8 and M=12. The device sizing of the designed switches is shown in Table II. To observe the effect of tapering at the internal nodes of the switch in the OFF state, the simulated drain voltages for each primary (A) device are shown in FIG. 14A for a 12-stack switch used in an RPS modulator where each of the B and C devices is $\frac{1}{12}$ the size of the A devices, in this case, 150 μm, and FIG. 14B for a tapered 12-stack switch sized as in Table II. The voltages across the FETs are more evenly distributed, allowing lower stress on each device and a significantly higher maximum voltage swing on the stacked switch. This leads to lower IL and higher power handling.

An alternative approach to increasing the number of stacked FETs is to transform the impedance ($Z_0$) down at the switch via standard techniques. This reduces the voltage requirements and allows shorter stacks to handle more power and maintain higher FBW. To compensate for a lower $Z_0$, the switches must be made larger to lower Ron relative to $Z_0$ for a higher reflection coefficient. In this case, the FBW is not limited because fewer FETs are required.

After optimizing for power handling, and phase and amplitude imbalance, an impedance transformation $Z_0$ in the range of 12.5-25Ω requires 8 stacked FETs with FETs $A_1$-$A_8$ each 5 mm wide. For a design without impedance transformation, the maximum useful number of stacks is 12 with each A device having a width of 1.8 mm. The secondary device sizing of the tapered ladder switches is given in Table II. The tapering factor for the B devices is x~2.5, while the tapering factor for the C devices is x~2.

TABLE II

SWITCH SIZING

| | 8 Stack | | 12 Stack | |
|---|---|---|---|---|
| FET Index | B Sizing | C Sizing | B Sizing | C Sizing |
| 1 | 5 mm | 5 mm | 1.8 mm | 1.8 mm |
| 2 | 1.25 mm | 1.25 mm | 450 μm | 450 μm |
| 3 | 312 μm | 312 μm | 112 μm | 112 μm |
| 4 | 104 μm | 200 μm | 38 μm | 72 μm |
| 5 | 52 μm | 138 μm | 19 μm | 50 μm |
| 6 | 39 μm | 113 μm | 14 μm | 40 μm |
| 7 | 36 μm | 96 μm | 13 μm | 35 μm |
| 8 | 35 μm | N/A | 12 μm | 30 μm |
| 9-12 | N/A | N/A | 12 μm | 28 μm |

Modulator Characterization

Figures 15A, 15B, 15C:
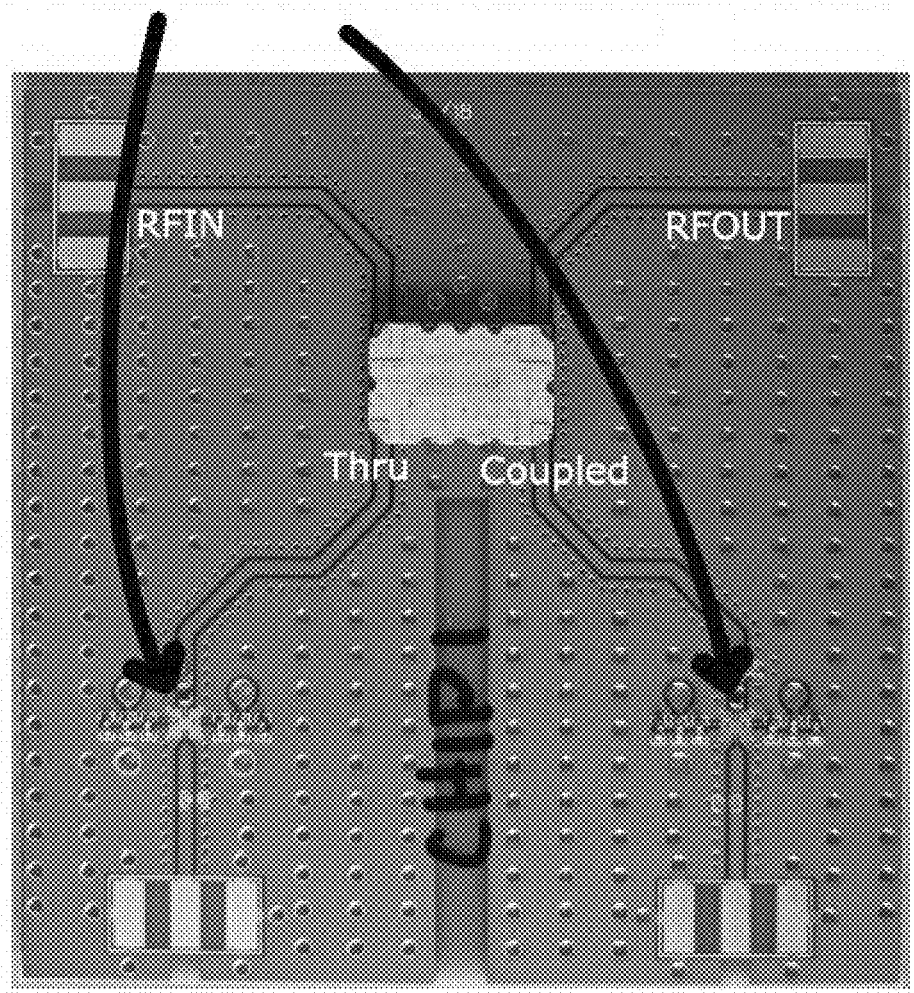
FIGS. 15A-15C are photographs of a respective 12-stack switch, 8-stack switch, and an RPS board with surface mount hybrid coupler.

The RF switches were designed and fabricated in the GlobalFoundries 45-nm SOI CMOS process. A micrograph of the 12-stack switch is shown in FIG. 15A, the 8 stack switch shown in FIG. 15B, and the PCB used to demonstrate the RPS shown in FIG. 15. The hybrid coupler used for both designs is the Anaren XC0900A-03S, chosen for operation at 1 GHz and 0.2 dB IL. An impedance transformation network from 50Ω to 25Ω was used at the input of the 8-stack switch. The switches within each RPS were placed at a distance from each other on the PCB to prevent interference between the two at large input power levels.

Figure 16A:
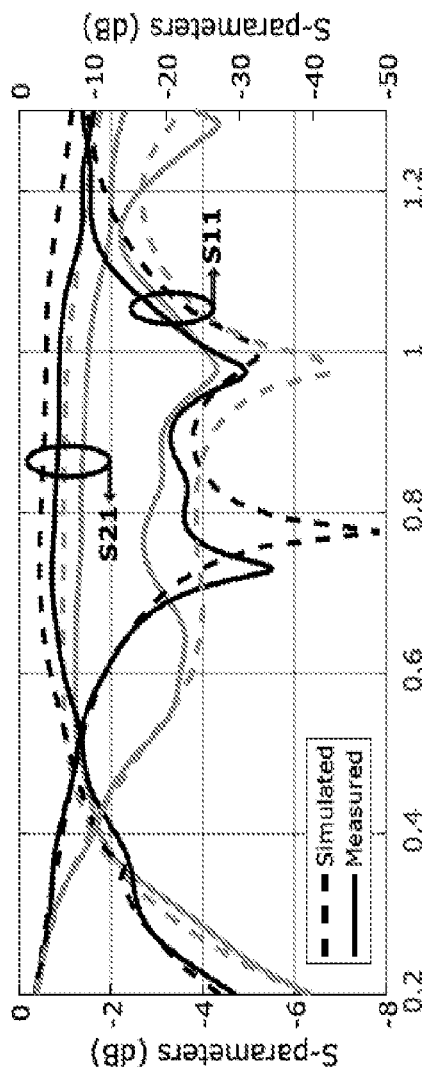
FIGS. 16A-16B are measured and simulated S-parameters of the 12-stack RPS in the ON and OFF states and of the 8-stack RPS in the ON and OFF states.
Figure 16B:
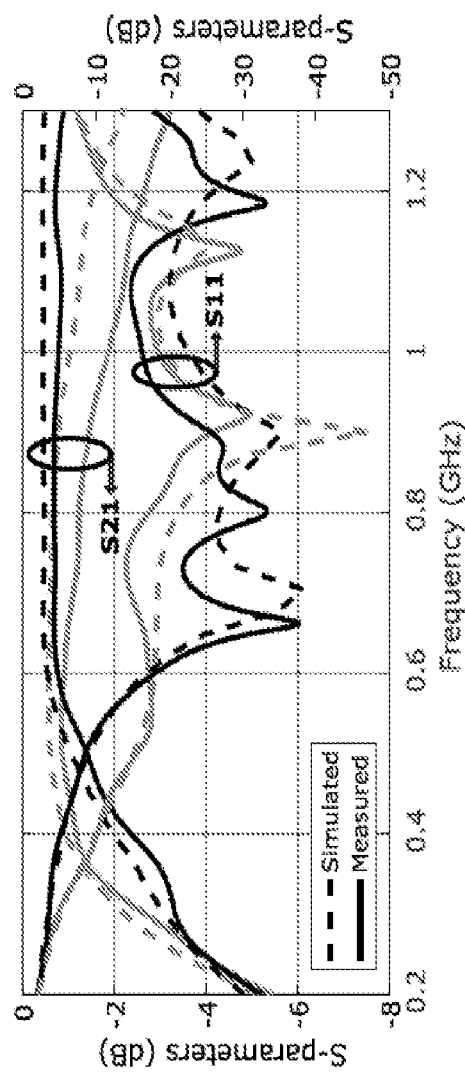

The measured small-signal S-parameters of the 12-stack RPS and 8-stack RPS are in FIGS. 16A and 16B, respectively. Both versions exhibit wideband matching and low loss from 600 MHz to 1.3 GHz. At 1 GHz, the losses of the 12-stack RPS are 0.88 and 1.5 dB in the OFF and ON states, respectively. For the 8-stack RPS, the losses are 0.78 and 1.9 dB in the two states, respectively.

Figure 17A:
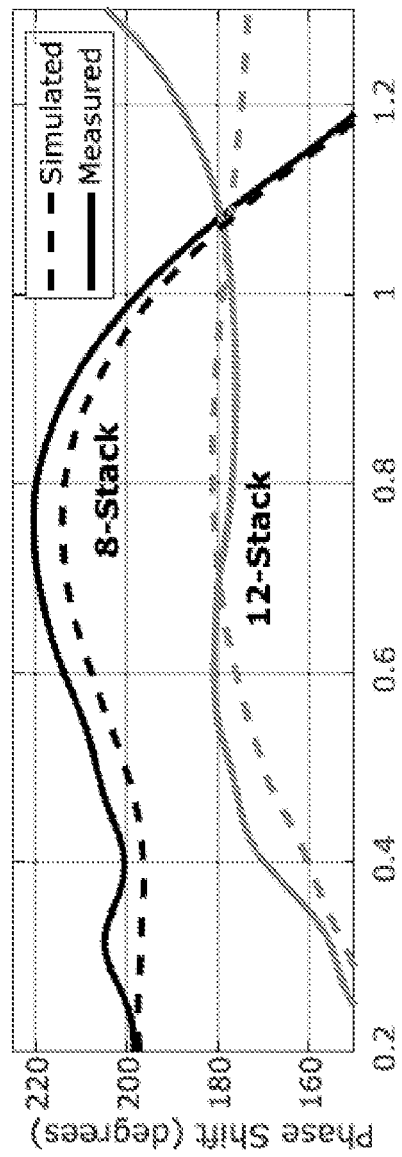
FIGS. 17A-17B are measured and simulated plots of respective phase shift created between the two states of each RPS amplitude error between the ON and OFF states of the 8-stack RPS and the ON and OFF states of the 12-stack RPS.
Figure 17B:
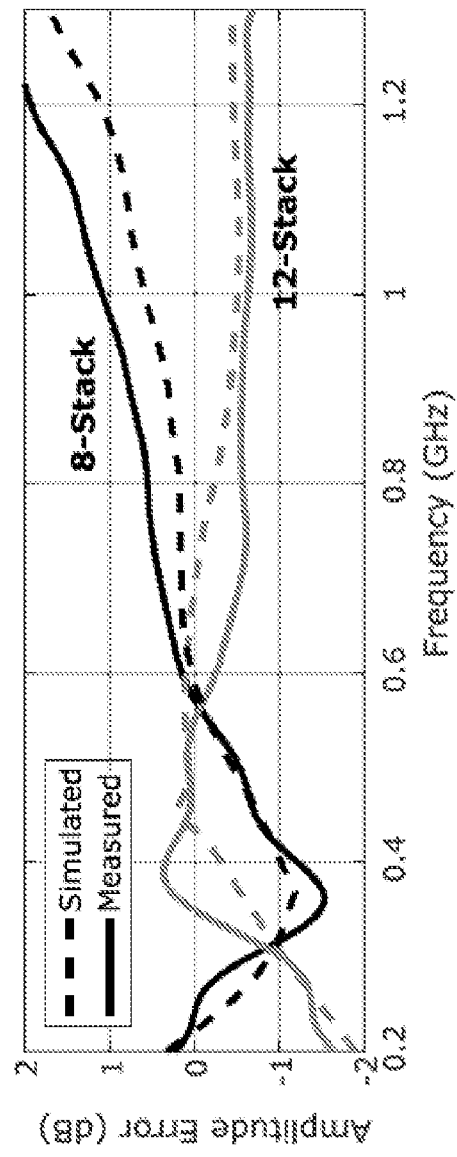

FIG. 17A shows the measured phase difference between the OFF and ON states of each RPS. The 12-stack RPS shows a very low phase error from 400 to 1200 MHz, while the 8-stack RPS shows a narrower response, due to the impedance transformation, with minimum phase error at 1.09 GHz. Both modulators display an amplitude error of less than 2 dB across the entire measured frequency range, as shown in FIG. 17B.

Figure 19A:
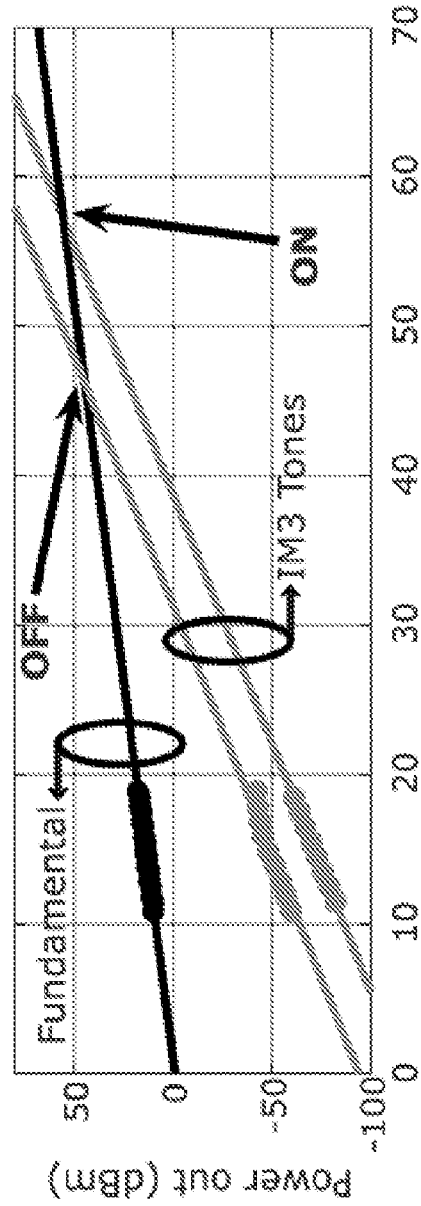
FIGS. 19A-19B are IIP3 measurements of the 12-stack RPS and the 8-stack RPS in both ON and OFF states.
Figure 19B:
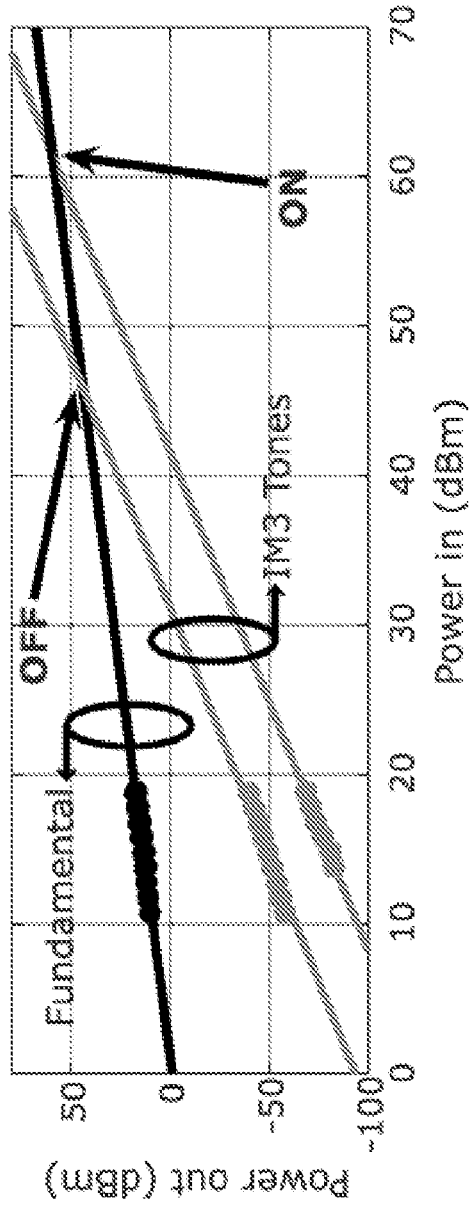

Measured compression characteristics are plotted in FIGS. 18A and 18B for the 12- and 8-stack RPS, respectively. In both modulators, the ON state has a higher compression point because it is limited by the ground wirebond inductance rather than any device characteristics. From FIGS. 15A and 15B, the grounds of the chips have been provided through several wirebonds, and therefore, the compression of the ON state does not occur until nearly 40 dBm. In the OFF state, the devices are voltage-limited by the switch and therefore compress at lower power levels. $P_{1dB}$ for the 12-stack RPS is 34.2 dBm, which corresponds to a simulated peak incident voltage of 23.2 V. For the 8-stack modulator, $P_{1\ dB}$ is 34.4 dBm in the limiting OFF state case, though at a lower voltage due to the impedance transformation. Simulated modulator compression is shown in FIGS. 18C and 18D. The discrepancy between the measured and simulated losses, particularly in the ON state can be attributed to nonideal modeling of the wirebonds, PCB, and lumped element impedance transformation network. The measured input referred third order intercept point (IIP3) is plotted in FIGS. 19A and 19B using a test bench with a maximum IIP3 of 62 dBm. The 12-stack RPS has an IIP3 of 46.3 and 57.4 dBm in the OFF and ON states, respectively, while the 8-stack RPS has an IIP3 of 46.2 and 61 dBm in the OFF and ON states, respectively.

Figure 20:
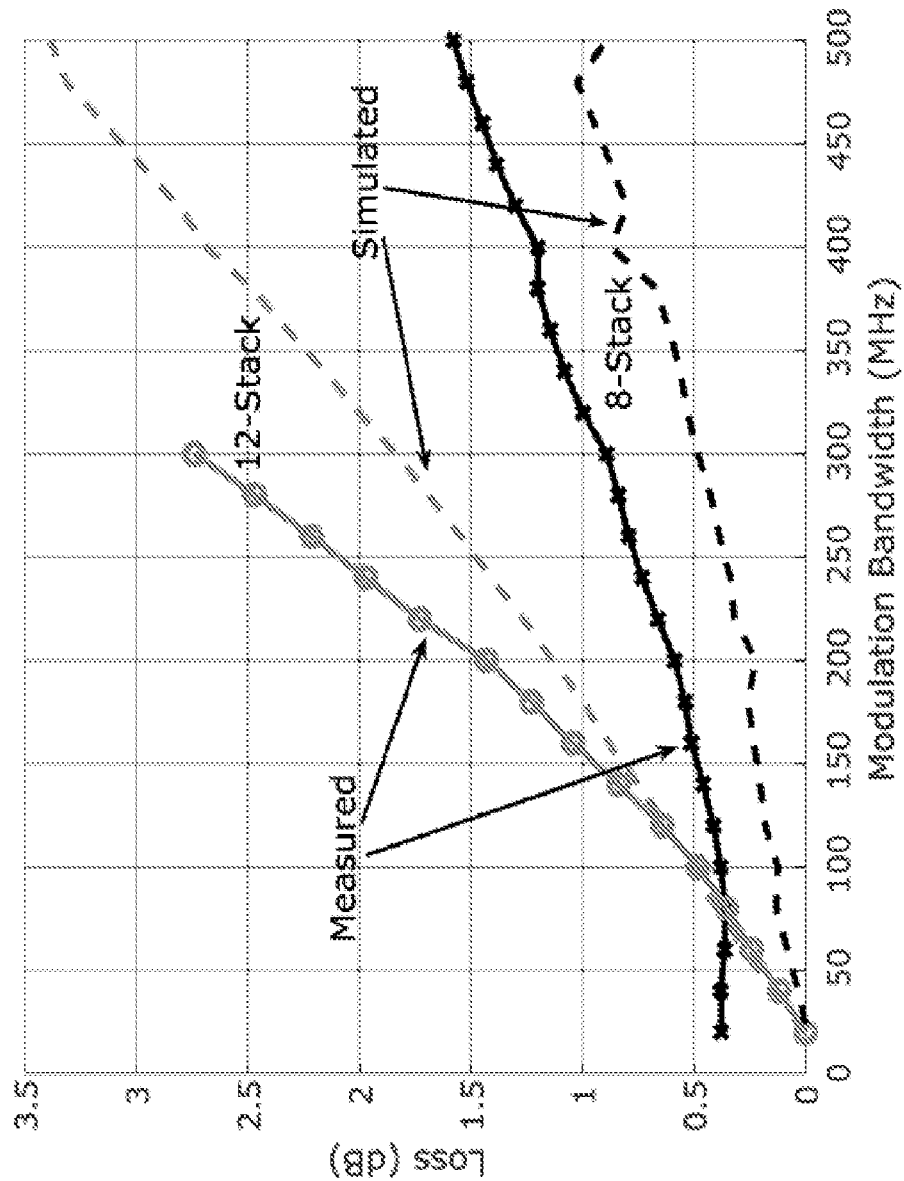
FIG. 20 plots loss of the 12- and 8-stack designs with 30-dBm input power with increasing modulation frequency, with loss normalized to the minimum losses of the 12-stack modulator.

FIG. 20 shows a significant difference between the two modulators. When modulated at low frequency, the total loss, including the hybrid coupler of the 12-stack RPS, is 1.4 dB and the loss of the 8-stack RPS is 1.6 dB. While the 12-stack modulator offers lower IL, faster switching favors the 8-stack RPS to maintain a lower IL over a wider bandwidth beyond 100 MHz. FIG. 20 plots the loss integrated over the two dominant lobes of modulated spectrum and normalizes to the minimum loss of the 12-stack modulator to show how performance degrades at faster switching speeds. The FBW is determined at the frequency when the losses increase by 1 dB compared with the minimum modulation losses.

PET for High-Power BPSK Modulation

The 3-W RPS modulators are used to produce BPSK modulation at high-power levels. To test the potential adjacent channel leakage reduction using PET, the 8-stack modulator is used because of its higher switching bandwidth to take advantage of the PET techniques. These ACLR measurements are at a center frequency of 1.09 GHz to minimize the phase imbalance and carrier leakage. It is important to look at the harmonic suppression and ACLR reduction with increasing data rates and over a range of CBWs. MATLAB was used to calculate the required PET waveforms that were sent to an M8195 AWG with a sample rate of 32 Gsamples/s. The output of the AWG was used to drive the control lines for the two switches in the RPS modulators, while the RF input was a 30-dBm CW signal generated by a 10-W linear amplifier.

Figure 21:
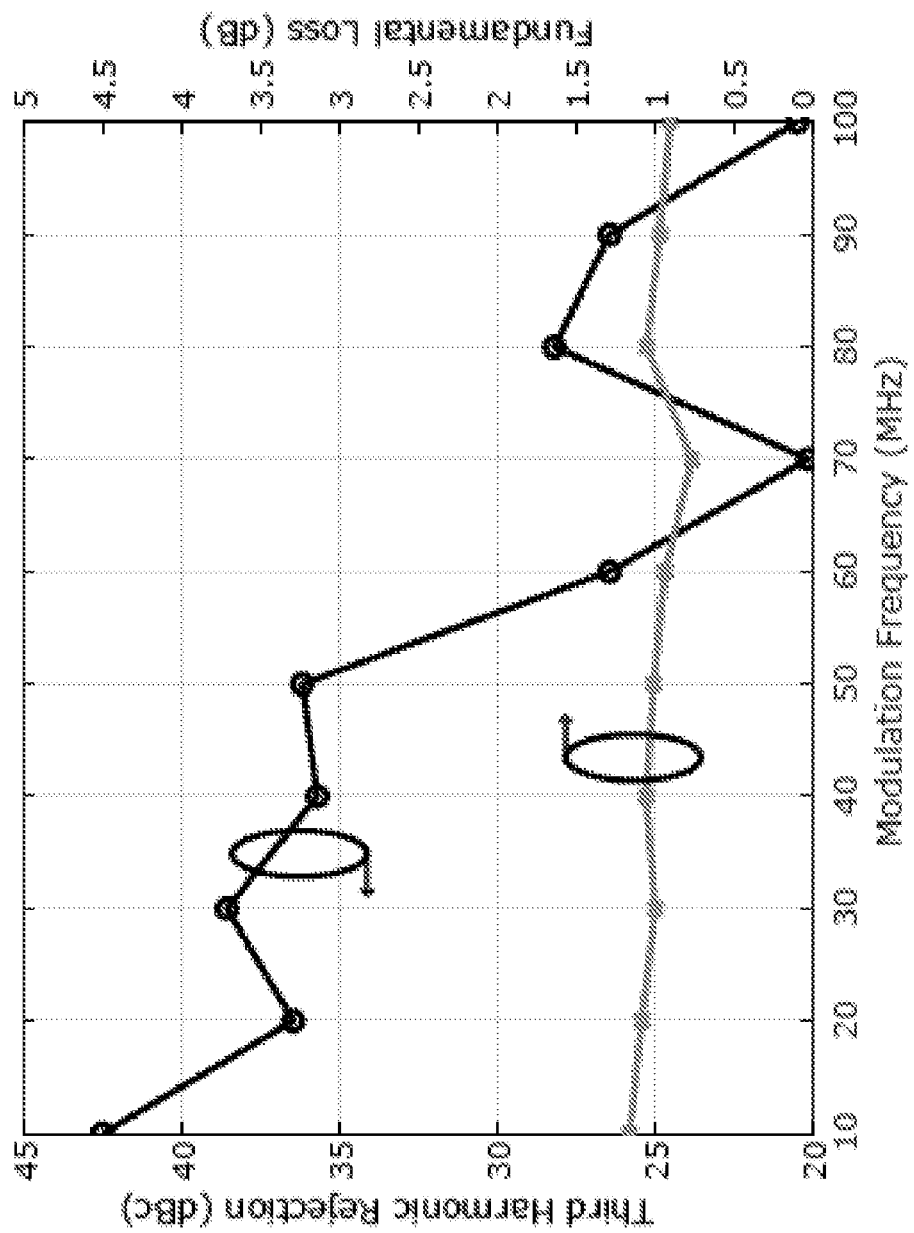
FIG. 21 plots third-harmonic rejection as a function of modulation rate and the loss at the fundamental.

FIG. 21 shows the third-harmonic rejection (PET N=1) n the 8-stack RPS modulator as the modulation frequency increases. The RPS modulator is able to maintain >35 dBc third-harmonic rejection up to a 50-MHz modulation bandwidth. Additionally, the loss at the fundamental frequency stays around 1 dB over the range of modulation frequency.

Figure 22:
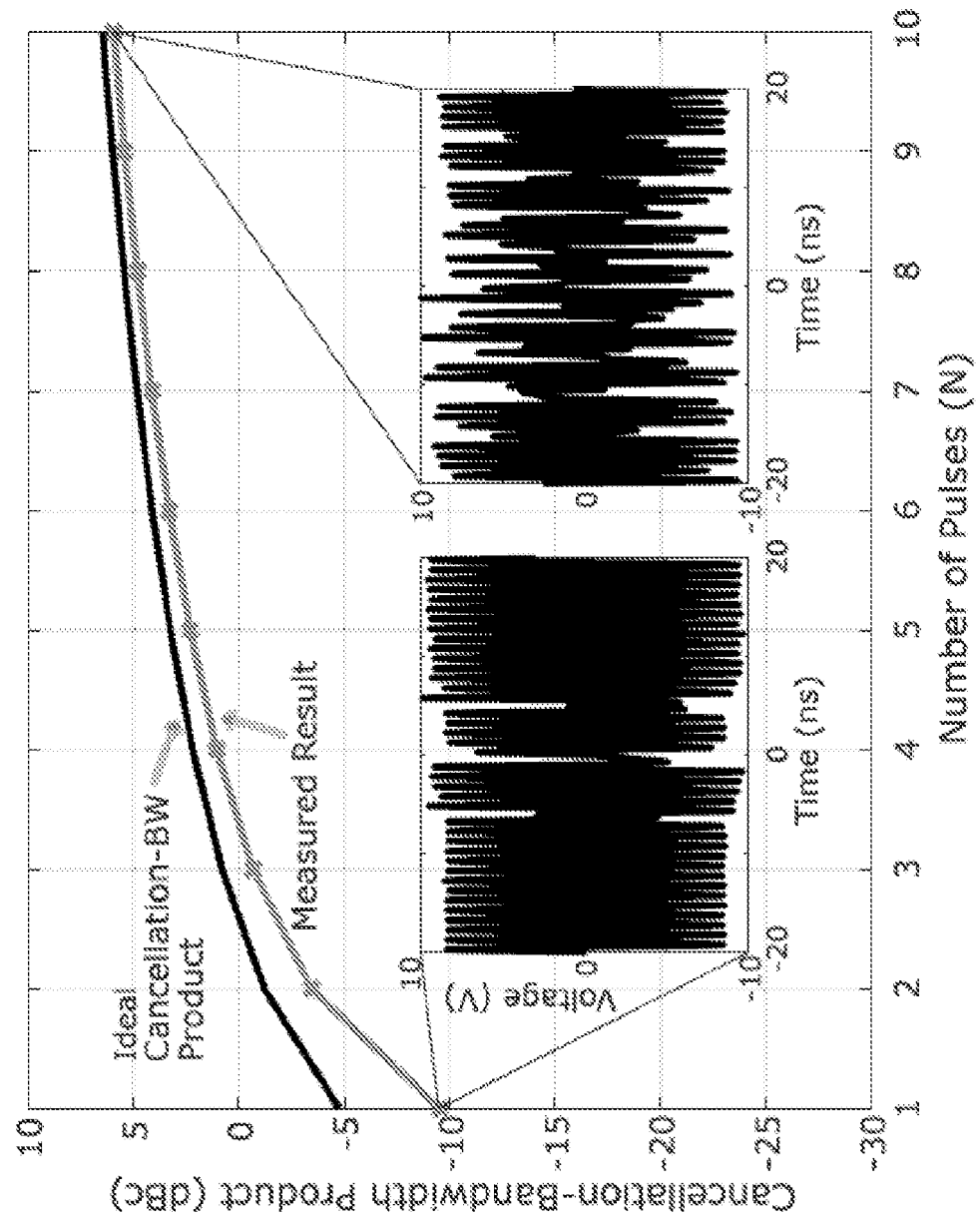
FIG. 22 illustrates rejection-bandwidth product for increasing values of N with the spectrum of the N=1 and N=10 PET waveform.

FIG. 22 gives the total rejected power for increasing numbers of pulses, N, with x(t) as a 10-MHz square wave. With additional pulses, the total energy removed from the spectrum remains relatively constant as the majority of the power is located within the first few harmonics. However, this power is canceled over a wider bandwidth and the measured data compares well with the simulated $C_{BW}$. As N is increased, the measured result approaches the ideal simulation since the BW becomes the dominant term in the $C_{BW}$ product and the rejection remains relatively good. Time-domain waveforms of the switching intervals are also shown in FIG. 22 for both N=1 and N=10. When N=10, the switching intervals shorten to <1 ns and the RPS modulator is unable to completely switch, though many of the lower harmonics are still canceled.

Figures 23A, 23B:
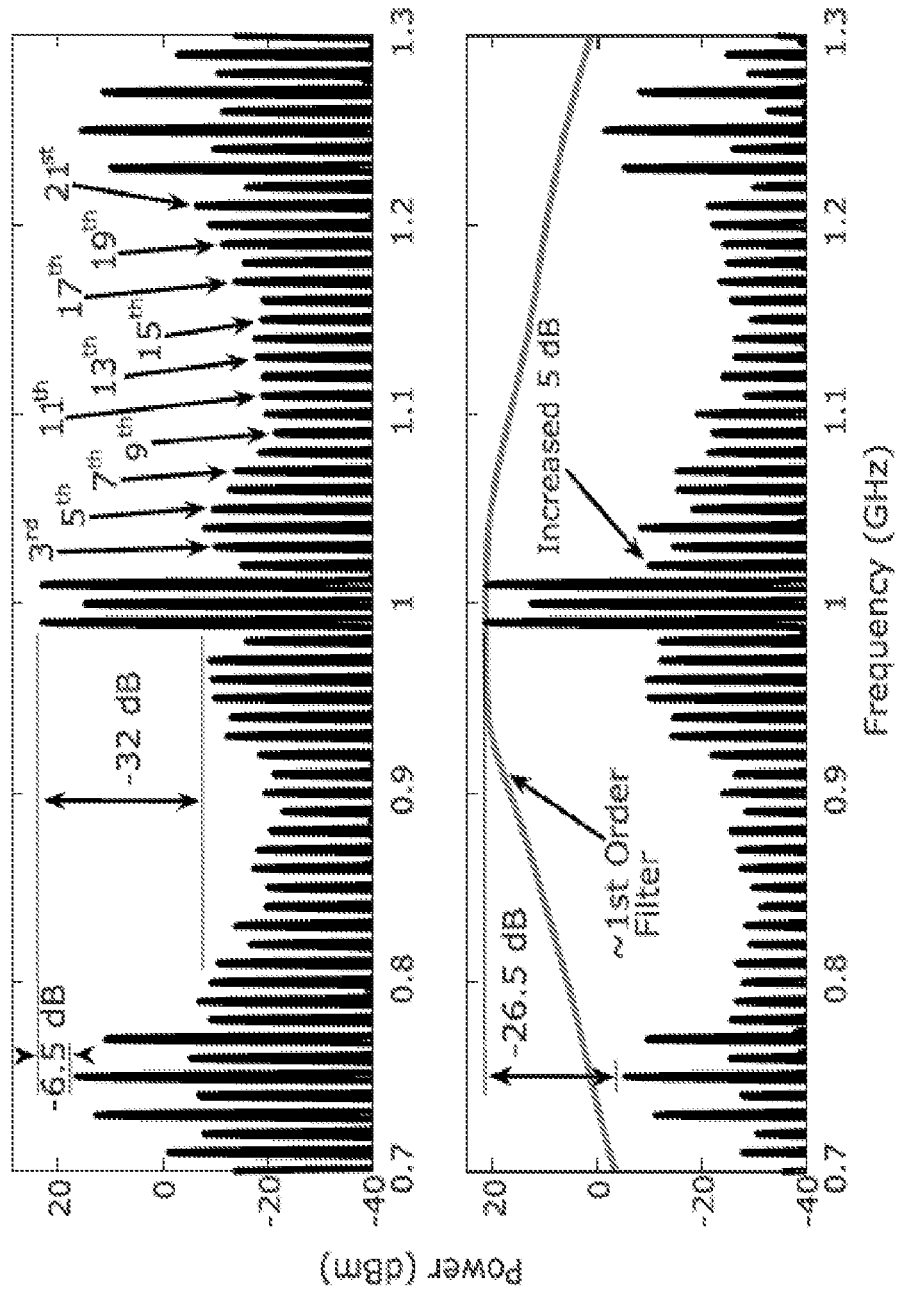
FIGS. 23A-23B are respective measured PET spectrum for a 10-MHz square wave when N=10 und measured PET spectrum after being passed through a 1-GHz, low Q filter with wideband harmonics are significantly attenuated, while near-band mixing from the nonlinearity is only marginally present.

FIG. 23A shows the output spectrum when N=10. The first ten odd harmonics are canceled, which results in a harmonic floor of −32 dBc across the first 21 harmonics. The higher odd harmonics, 23-27, are increased above what they would normally be since the PET method shifts the energy from the low harmonics to higher ones. Using a first-order BPF with a bandwidth of 100 MHz causes the highest harmonic power to be suppressed to −26.5 dBc, shown in FIG. 23B, and demonstrates the ability of the present PET method to relax the OOB filtering requirements. The OOB harmonic power may be reflected off the filter and mixed again by the RPS modulator or by the PA nonlinearity, back in-band and cause interference. In the example of FIG. 23B, it was observed that the second harmonic increased by 5 dB due to the impedance reflection but remains at a power less than that of other harmonics that are canceled by the PET technique. All other harmonics were only attenuated by the addition of the filter.

Figures 24A, 24B, 24C:
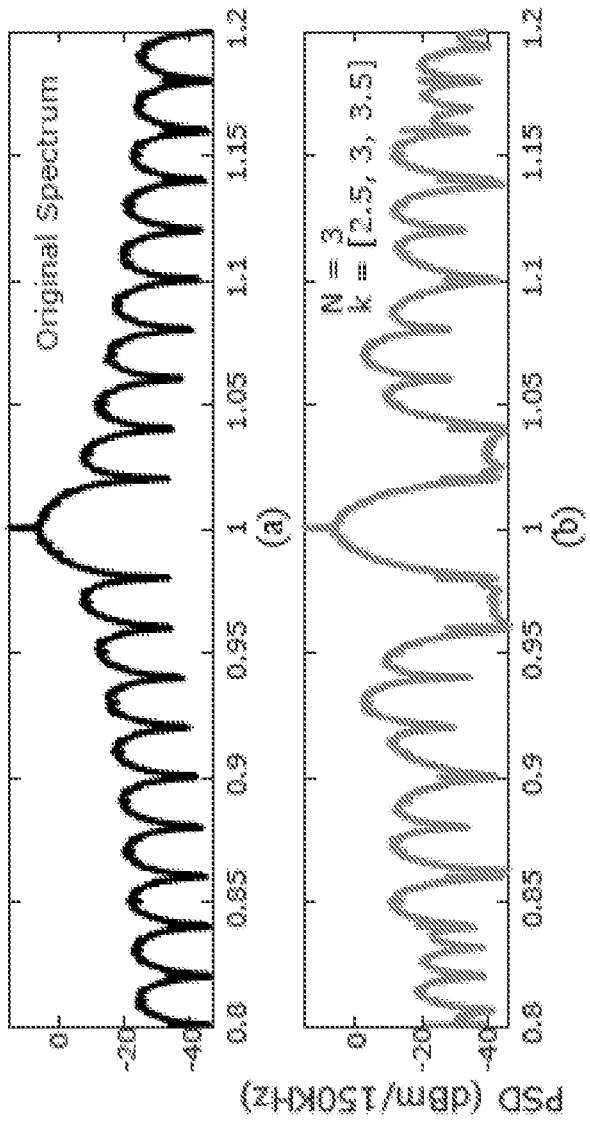
FIGS. 24A-24C measured DRFM spectra created using the 8-stack modulator with respective original spectrum, canceling the first lobe with N=3, and canceling the first two lobes with N=4 all with a data rate of 20 Msymbols/s.

FIGS. 24A-24C show the examples of using PET waveforms for ACLR reduction. At a symbol rate of 20 Msymbols/s, significant sidelobe reduction is achieved as shown in FIG. 24B for one adjacent channel and FIG. 2C for two adjacent channels. Similar to square-wave modulation, the rejection is limited by the maximum switching bandwidth of the modulator.

Figure 25:
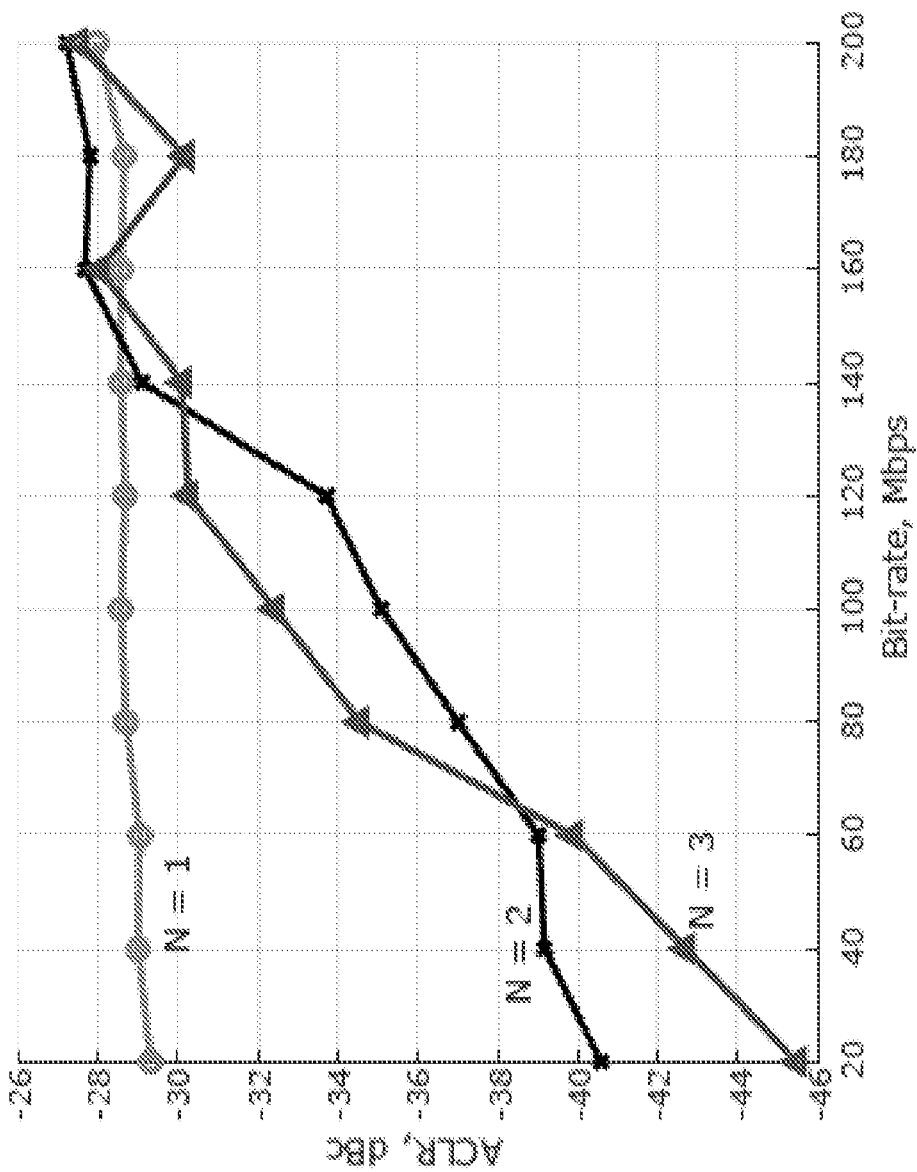
FIG. 25 shows measured ACLR for one canceled lobe for increasing symbol rates and different values for N.

FIG. 25 plots the ACLR reduction over the bandwidth of the first sidelobe with increasing symbol rate. The N=1 case indicates a relative constant ACLR of −28 dBc over the data rate. For N=2 and N=3, an ACLR of better than −40 dBc is realized. In the case of N=3, the required switching rate is roughly 11 GHz for a bit rate of 200 Msymbols/s based on Table I. Since the 8-stack modulator is not capable of this switching speed, the ACLR is significantly reduced from the predicted level. However, the RC-limited waveform still provides some ACLR reduction. For N=3, the ACLR is not improved over N=2 beyond 60 Msymbols/s when using this RPS modulator.

Figures 26A, 26B, 26C:
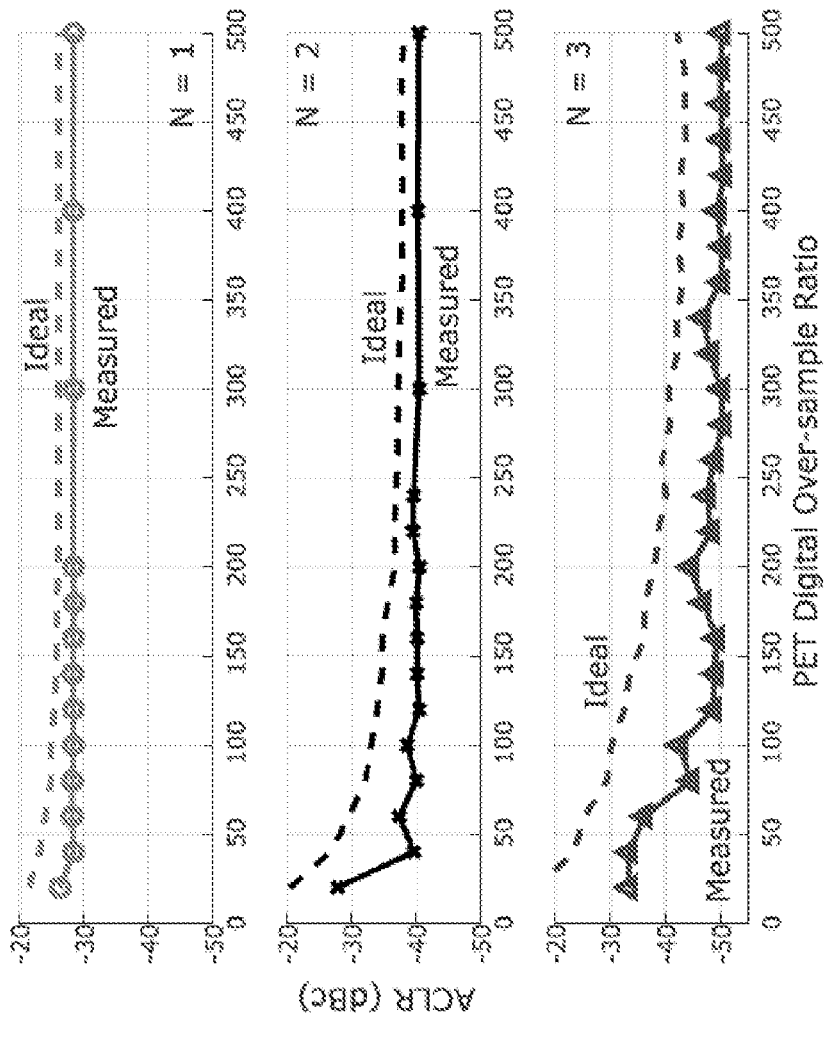
FIGS. 26A-26C shows respective measured ACLR with 2-Msymbols/s baseband signal for increasing OSRs, when the signals were generated by artificially lowering the sample rate on the 32-Gsamples/s arbitrary waveform generator.

While FIG. 25 shows the RF bottleneck for the present PET method, FIGS. 26A-26C illustrate the digital bottleneck. This can be measured by lowering the data rate significantly below the switching bandwidth of the modulator and then reducing the sample rate of the driving AWG. For a 2-Msymbols/s signal, the PET pulses were generated by limiting the sample rate of the 32-Gsamples/s arbitrary waveform to measure the ACLR at different digital OSRs. For each of N=1, 2, and 3, excellent performance is still achieved at relatively low OSRs. The measured results match well with the ideal ALCR simulated in MATLAB and are in fact slightly better due to carrier leakage increasing the in-band power while not affecting the power measured in the adjacent sidelobes. To verify this assumption, measurements were performed at both 1 and 1.09 GHz, and it was observed that the discrepancy between the ideal and measured values decreased at 1.09 GHz compared to 1 GHz as the carrier leakage was reduced.

Figure 27:
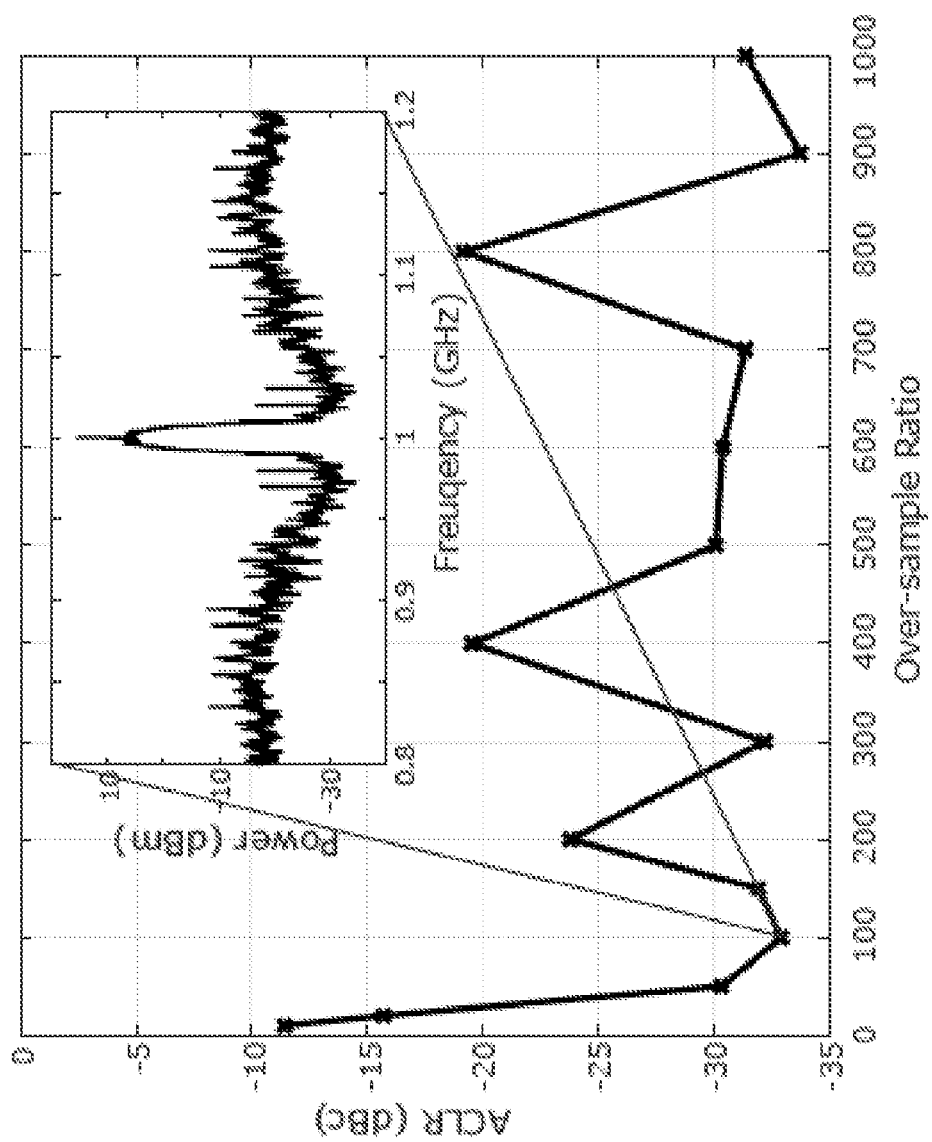
FIG. 27 measured ACLR for increasing oversample ratios using the ΣΔM technique in conjunction with the 8-stack RPS power modulator and 20-Msymbols/s BPSK data.

Finally, the 8-stack modulator was measured with a ΣΔM approximation of a 20-Msymbols/s raised cosine signal, as shown in FIG. 27. For oversampling rates greater than 100 times the symbol rate, the power modulator is limited by switching speed, and the theoretical benefits of increased OSR are not realized. Comparing FIGS. 25 and 27 show that when using the PET method with the same power modulators, the PET method is capable of achieving >10 dB more ACLR than ΣΔM at the same bandwidth. Table I predicts this result in which PET gives better ACLR than ΣΔM when the RF switching bandwidth is the limiting factor in the system Table III summarizes the performance of the two designs compared to previous works. Insertion loss is quoted as the modulated insertion loss and therefore lies between the loss of the ON and OFF states. A maximum power consumption of 38 mW was measured from a 1 V supply when the 8-stack RPS was modulated at a BW of 500 MHz. A figure of merit can be used to determine if the loss-FBW-power trade-offs are overcome and is given by:

$$FOM = \frac{FBW \cdot P_{1dB}}{(1 - IL) + \frac{P_{drive}}{P_{1dB}}}$$

TABLE III

| COMPARISON WITH OTHER DRFM INTERFACES | | | | | | | |
|---|---|---|---|---|---|---|---|
| | [24] | [9] (A) | [9] (B) | [14] | [16] | 12-stack | 8-stack |
| Technology | 45 SOI | 45 SOI | 45 SOI | 0.3 µm GaAs | NXP LDMOS | 45 SOI | 45 SOI |
| Frequency | 5 GHz | 1 GHz | 1 GHz | 2.46 GHz | 1 GHz | 1 GHz | 1 GHz |
| Insertion Loss | N/A | 2.4 dB | 2.6 dB | 2 dB | N/A | 1.4 dB | 1.6 dB |
| FBW | ~48% | 60% | 12% | N/A | N/A | 16% | 46% |
| P1dB | 29.6 dBm | 30.9 dBm | 40.1 dBm | 20 dBm | 39 dBm | 34.1 dBm | 34.4 dBm |
| IIP3 | N/A | 43 dBm | 56 dBm | N/A | N/A | 46 dBm | 46 dBm |
| FOM | N/A | 69 | 113 | N/A | N/A | 72 | 201 |
| ACLR | N/A | N/A | N/A | −18 dBc | −50 dBc | N/A | −45.5 dBc |
| Cancellation BW | N/A | N/A | N/A | 4 MHz | 5 MHz | N/A | >60 MHz |

The preferred embodiment demonstrates a direct RF modulation method and circuit that present both a signal processing approach using pulse encoded transitions to reduce the adjacent channel leakage ratio and a low-loss, high-bandwidth, high-power BPSK modulator based on two versions of a reflection phase shifter. Trade-offs are presented in which more stacked devices allows for smaller phase and amplitude imbalance over a wider bandwidth, while impedance transformation allows for higher modulation bandwidth at similarly high power handling. The BPSK modulator is demonstrated to reduce ALCR to −45.5 dBc at a data rate of 20 Mbps.

Figure 28:
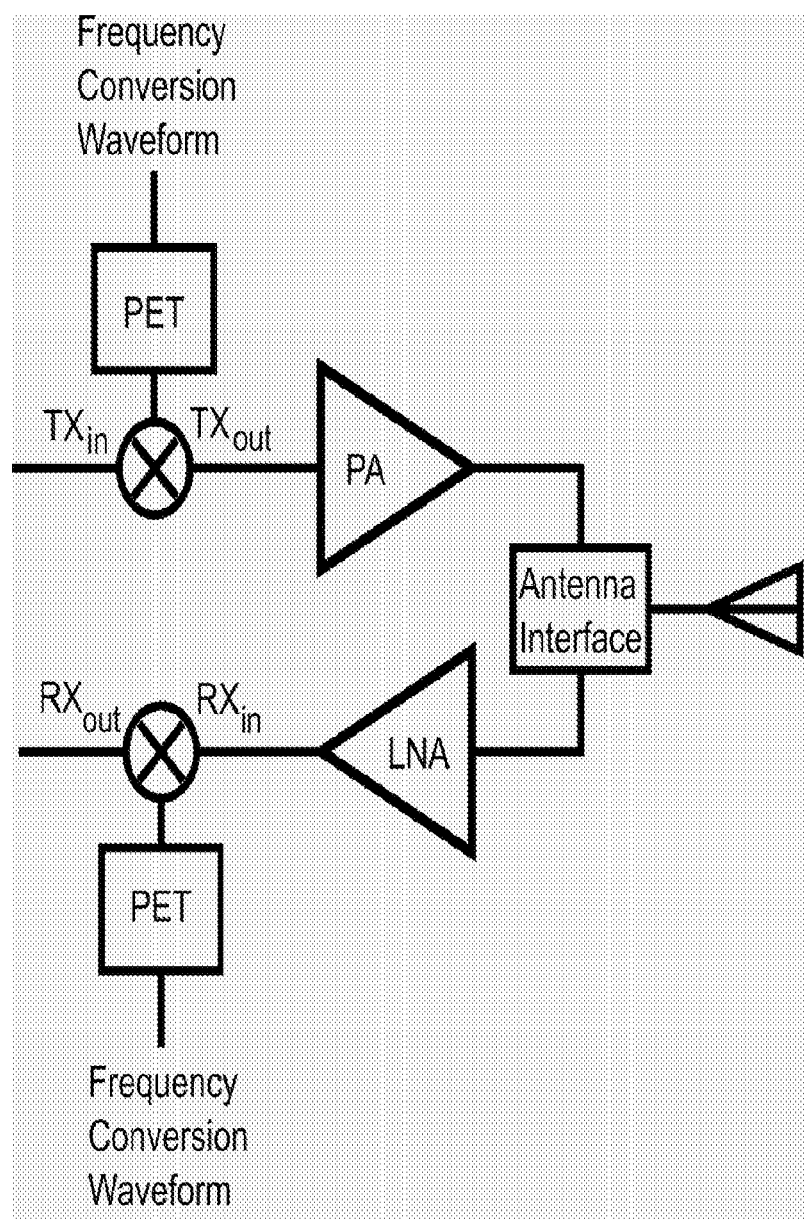
FIG. 28 illustrates that the present PET method of the invention applied to a general system to cancel harmonics from a generated digital waveform.
Figure 29A:
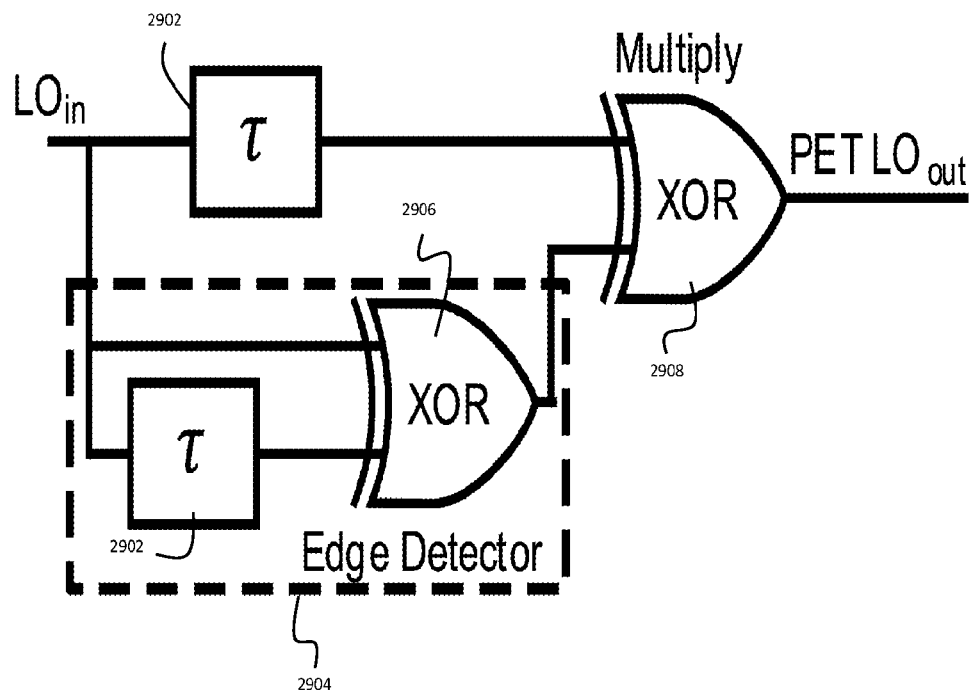
FIG. 29A illustrates a preferred hard-wired PET implementation.
Figures 29B, 29C:
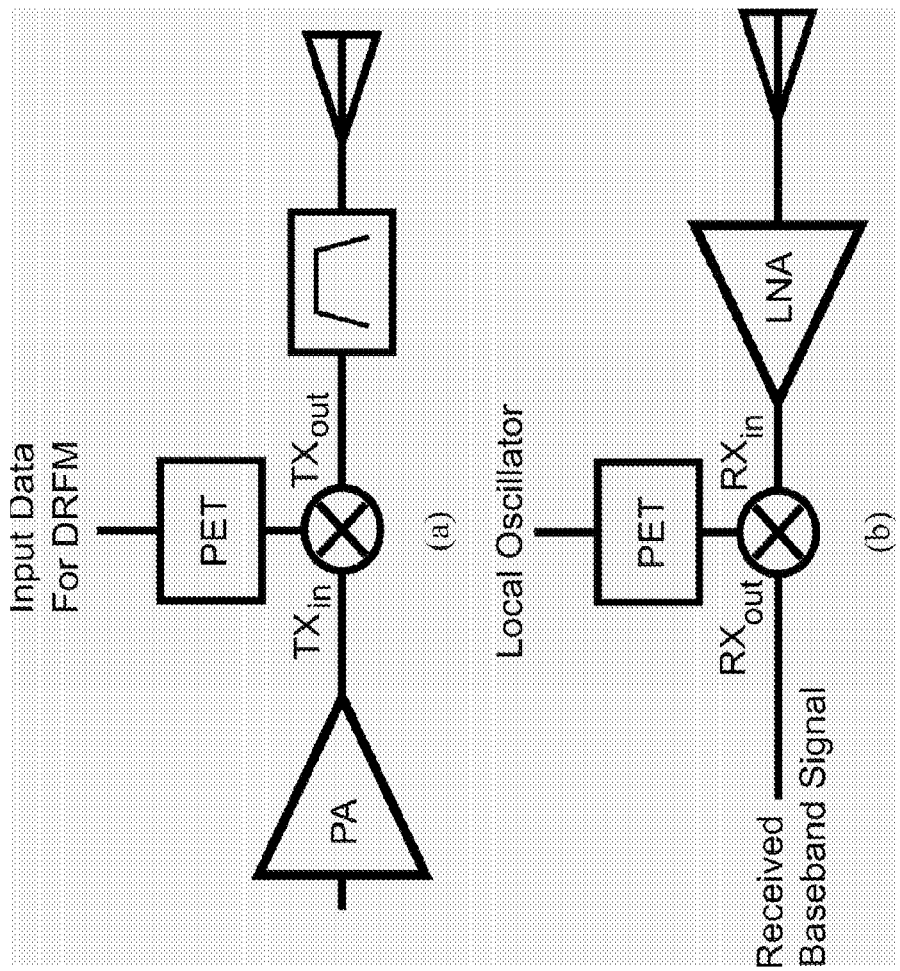
FIG. 29B illustrates the present PET method applied to a DRFM.
FIG. 29C illustrates the present PET method configured as a harmonic rejection mixer.

Artisans will appreciate that the invention provides a general technique for eliminating harmonics in the digital domain and has many applications. For example, FIG. 28 illustrates that the PET approach discussed above is applicable to any system that can use the PET algorithm to cancel harmonics regardless of the circuit/system configuration that generated the digital waveform, in this case, harmonic rejection mixers in a traditional transmitter architecture. Such mixers would use an edge detector and a delay to add the appropriate pulses to the LO waveforms such that the harmonic content is reduced, as shown by the hardwired PET circuit of FIG. 29A. In FIG. 29A, a local oscillator input $LO_{in}$ is provided to a tunable delay line 2902 and an edge detector 2904 consisting of matching tunable delay line 2902 and XOR logic function 2906. Another XOR 2908 is used to multiply the pulses generated by the edge detector 2904 with the original, but delayed, $LO_{in}$ signal at each edge. As another example, the PET is applied to a DRFM (Direct Radio Frequency Modulation) system in FIG. 29B. The PET method of the invention eliminates noise in the digital representation (digital input data of an RF input signal), which is then mixed with a carrier from a power amplifier and transmitted. FIG. 29C shows application of the present PET method as a harmonic rejection mixer. Application of the PET to the signal from a local oscillator provides a waveform to reject harmonics in a received baseband signal.

Figure 30:
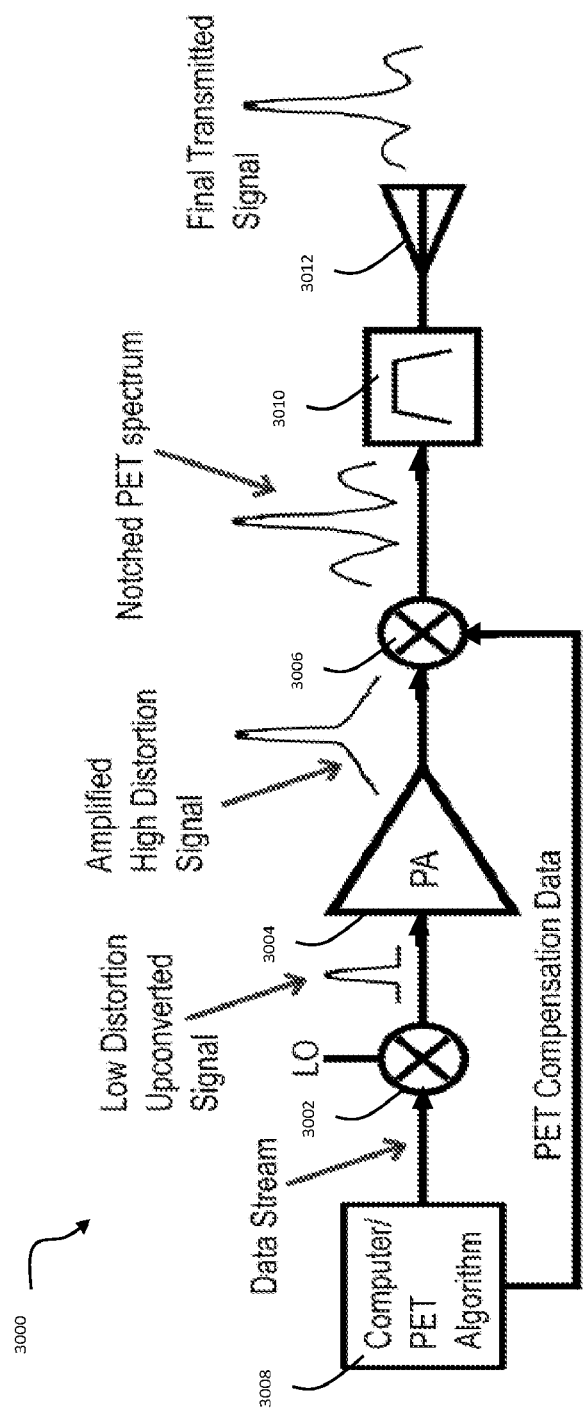
FIG. 30 is a schematic of a preferred embodiment hybrid DRFM system using a traditional transmit chain and a PET distortion canceller.

FIG. 30 illustrates a preferred hybrid PET system of the invention. The FIG. 1A PET system relies on the modulator 104 after the power amplifier 102 to generate both the data stream and the additional transitions for harmonic cancellation. FIG. 30 provides a hybrid system 3000. A data stream of a base-band signal is provided to a local oscillator 3002 that generates an upconverted, low distortion signal. This signal is amplified by a PA 3004 as in a traditional radio architecture, which creates an amplified high-distortion signal. A processor 3008 is able to also control a post PA modulator 3006 with PET transitions, assuming both the data stream ad the distortion characteristics of the power amplifier are known. This post-PA modulator 3006 acts as a tunable pseudo-filter to eliminate distortion products that result from highly non-linear, but efficient, PAs A filter 3010 filters higher order distortion, and the final signal is transmitted though an antenna 3012. The system 3000 can ease the implementation of complex forms of modulation while still benefiting form the wideband harmonic cancellation of the PET waveforms. It can also relax the requirements for digital pre-distortion which would normally be used to eliminate distortion from the PA output. The reconfigurable nature of this pseudo-filter is highly desirable for many software defined radios or broad application commercial products.

Figure 31:
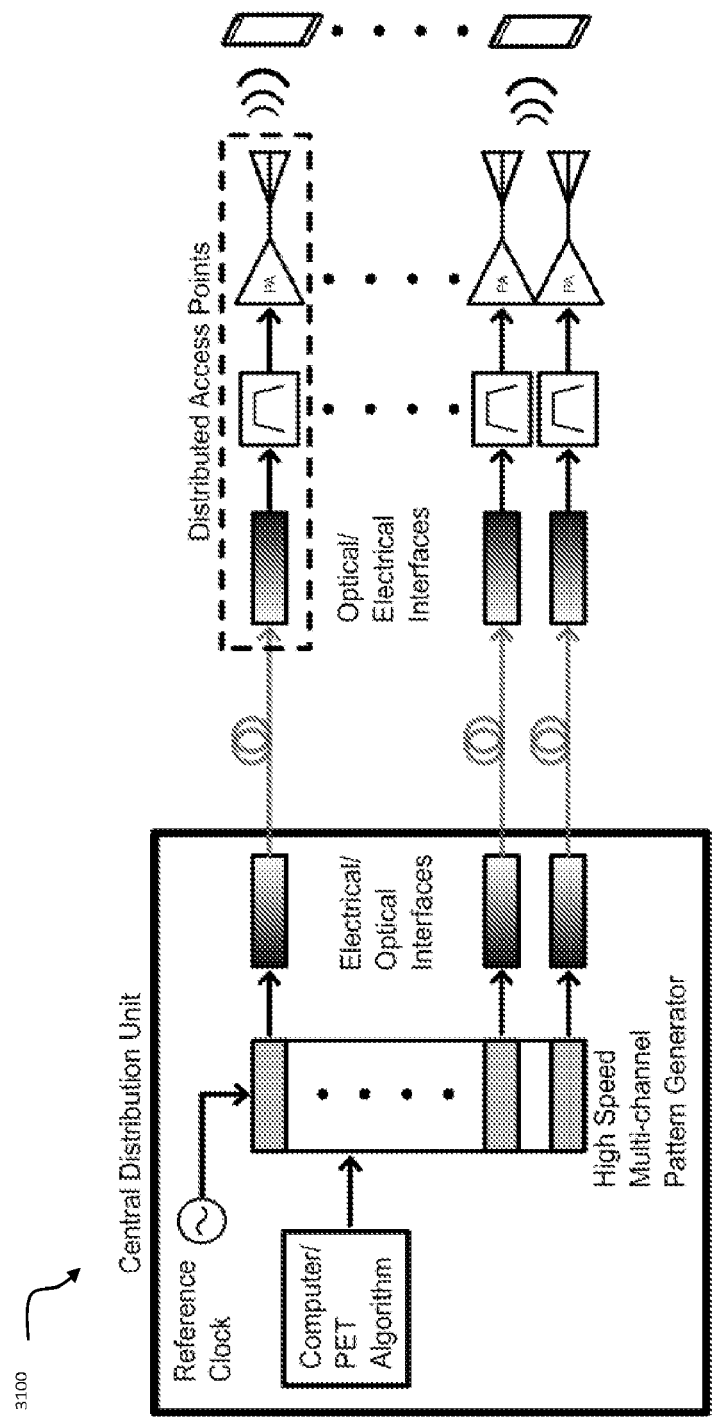

FIG. 31 illustrates a system 3100 that uses the PET waveforms to estimate the RF signal in a distributed MIMO system. Distributed MIMO systems in which multiple antennas at different locations are communicating with each receiver at any given time have the advantages of increased channel diversity, reduced correlation between users, and tolerance to fading from individual broadcast locations. While significant separation between the antennas has the above advantages, it increases the difficulty in synchronization and channel estimation between each transmit antenna and the receiver. Having independent base-stations at each antenna would be expensive in hardware, while using a single base-station which distributes signals to distant antennas becomes lossy due to long copper cabling between the central distribution unit and each transmitter. In the system 3100, linearity constraints of the optical electrical interfaces can be overcome by transmitting only digital approximations of the RF signals. Therefore, PET transmissions can be used to simplify the transmit chain through the optical modulators and improve the signal integrity over long distances. Additionally, since PET waveforms have low ACLR, multiple bands of RF can be transmitted over the fiber link as would be used in OFDM systems.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

REFERENCES

[1] A. Balteanu, I. Sarkas, E. Dacquay, A. Tomkins, and S. P. Voinigescu, "A 45-GHz, 2-bit power DAC with 24.3 dBm output power, <14 Vpp differential swing, and 22% peak PAE in 45-nm SOI CMOS," in Proc. IEEE Radio Freq. Integr. Circuits Symp. (RFIC), June 2012, pp. 319-322.

[2] A. Balteanu, I. Sarkas, E. Dacquay, A. Tomkins, G. M. Rebeiz, P. M. Asbeck, and S. P. Voinigescu, "A 2-bit, 24 dm, millimeter-wave SOI CMOS power-DAC cell for watt-level high-efficiency, fully digital M-ary QAM transmitters," IEEE J. of Solid-State Circuits, vol. 48, no. 5, pp. 1126-1137, May 2013.

[3] A. Balteanu, S. Shopov, and S. P. Voinigescu, "A high modulation bandwidth, 110 GHz power-DAC cell for IQ transmitter arrays with direct amplitude and phase modulation," IEEE J. of Solid-State Circuits, vol. 49, no. 10, pp. 2103-2113, October 2014.

[4] S. Shopov, N. Cahoon, and S. P. Voinigescu, "Ultra-broadband I/Q RF-DAC transmitters," IEEE Trans. on Microw. Theory and Techn., vol. 65, no. 12, pp. 5411-5421, December 2017.

[5] F. Thome and O. Ambacher, "A W-band wireless communication transmitter utilizing a stacked-FET oscillator for high output power performance," in 2016 IEEE MTT-S Int. Microw. Symp. Dig., May 2016, pp. 1-4.

[6] X. J. Xu and Y. E. Wang, "A direct antenna modulation (DAM) transmitter with a switched electrically small antenna," in 2010 Int. Workshop on Antenna Tech., March 2010, pp. 1-4.

[7] W. Yao and Y. E. Wang, "Radiating beyond the bandwidth using direct antenna modulation," in IEEE Antennas and Propag. Soc. Symp., vol. 1, June 2004, pp. 791-794 Vol. 1.

[8] K. Schab and J. Adams, "Calculation of radiation transients in direct antenna modulation systems," in IEEE Int.

Symp. on Antennas and Propag. USNC/URSI Nat. Radio Science Meeting, July 2017, pp. 521-522.
[9] C. Hill, C. S. Levy, H. AlShammary, A. Hamza, and J. F. Buckwalter, "RF watt-level low-insertion-loss high-bandwidth SOI CMOS switches," IEEE Trans. on Microw. Theory and Techn., vol. 66, no. 12, pp. 5724-5736, December 2018
[10] H. AlShammary, C. Hill, A. Hamza, and J. F. Buckwalter, "A λ/4-inverted N-path filter in 45-nm CMOS SOI for transmit rejection with code selective filters," in IEEE/MTT-S Int. Microw. Symp. Dig., June 2018, pp. 1370-1373.
[11] A. Hamza, H. Alshammary, C. Hill, and J. F. Buckwalter, "A series N-path code selective filter for transmitter rejection in full-duplex communication," IEEE Micro. Compon. Lett., vol. 29, no. 1, pp. 38-40, January 2019.
[12] A. Jayaraman, P. F. Chen, G. Hanington, L. Larson, and P. Asbeck, "Linear high-efficiency microwave power amplifiers using bandpass delta-sigma modulators," IEEE Microw. and Guided Wave Lett., vol. 8, no. 3, pp. 121-123, March 1998.
[13] Y. E. Wang, "An improved kahn transmitter architecture based on delta-sigma modulation," in IEEE/MTT-S Int. Microw. Symp. Dig., vol. 2, June 2003, pp. 1327-1330 vol. 2.
[14] A. Dupuy and Y. E. Wang, "High efficiency power transmitter based on envelope delta-sigma modulation (EDSM)," in IEEE 60th Vehicular Tech. Conf., 2004. VTC2004-Fall. 2004, vol. 3, September 2004, pp. 2092-2095 Vol. 3.
[15] K. Hausmair, S. Chi, P. Singerl, and C. Vogel, "Aliasing-free digital pulse-width modulation for burst-mode RF transmitters," IEEE Trans. on Circ. and Sys., vol. 60, no. 2, pp. 415-427, February 2013.
[16] U. Gustavsson, T. Eriksson, and C. Fager, "A general method for pass-band quantization noise suppression in pulsed transmitter architectures," in IEEE/MTT-S Int. Microw. Symp. Dig., June 2009, pp. 1529-1532.
[17] C. Hill, A. Hamza, H. AlShammary, and J. F. Buckwalter, "A 1.5-dB insertion loss, 34-dBm p1 dB power modulator with 46% fractional bandwidth in 45-nm CMOS SOI," in IEEE/MTT-S Int. Microw. Symp., June 2019.
[18] S. C. Tang and G. T. Clement, "A harmonic cancellation technique for an ultrasound transducer excited by a switched-mode power converter," in IEEE Ultrason. Symp., November 2008, pp. 2076-2079.
[19] P. R. Smith, D. M. J. Cowell, and S. Freear, "Width-modulated square-wave pulses for ultrasound applications," IEEE Trans. on Ultrason., Ferroelect., and Freq. Control, vol. 60, no. 11, pp. 2244-2256, November 2013.
[20] J. A. Weldon, R. S. Narayanaswami, J. C. Rudell, M. Otsuka, S. Dedieu, and P. R. Gray, "A 1.75-gHz highly integrated narrow-band CMOS transmitter with harmonic-rejection mixers," IEEE J. of Solid-State Circuits, vol. 36, no. 12, pp. 2003-2015, December 2001.
[21] M. Jeon, J. Woo, S. Park, and Y. Kwon, "A pulsed dynamic load modulation technique for high-efficiency linear transmitters," IEEE Trans. on Microw. Theory and Techn., vol. 63, no. 9, pp. 2854-2866, September 2015.
[22] J. Jeong and Y. E. Wang, "Pulsed load modulation (PLM) technique for efficient power amplification," IEEE Trans. on Circuits and Sys. II: Express Briefs, vol. 55, no. 10, pp. 1011-1015, October 2008.
[23] M. M. Ebrahimi and M. Helaoui, "Reducing quantization noise to boost efficiency and signal bandwidth in deltasigma-based transmitters," IEEE Trans.s on Microw. Theory and Techn., vol. 61, no. 12, pp. 4245-4251, December 2013.
[24] C. S. Levy, P. M. Asbeck, and J. F. Buckwalter, "A CMOS SOI stacked shunt switch with sub-500 ps time constant and 19-Vpp breakdown," in IEEE Compound Semiconductor Integr. Circuit Symp., October 2013, pp. 1-4.

The invention claimed is:

1. A method for switching interval modulation, comprising: modulating an RF input data signal while generating and inserting additional pulses in transitions of the data signal, wherein the additional pulses are structured to shift transition noise into higher order harmonics; and filtering the higher order harmonics: wherein the generating is conducted in the digital domain and wherein, during generating, the additional pulses are determined by the number of harmonics which are desired to be cancelled and ensure that no added pulse is wider than then an original data bit.

2. A method for switching interval modulation, comprising:
modulating an RF input data signal while generating and inserting additional pulses in transitions of the data signal, wherein the additional pulses are structured to shift transition noise into higher order harmonics; and filtering the higher order harmonics;
wherein the generating is conducted in the digital domain and wherein the additional pulses are inserted at every one of the transitions.

3. A method for switching interval modulation, comprising:
modulating an RF input data signal while generating and inserting additional pulses in transitions of the data signal, wherein the additional pulses are structured to shift transition noise into higher order harmonics; and filtering the higher order harmonics;
wherein the generating is conducted in the digital domain and wherein the additional pulses are centered at the transitions.

4. A method for switching interval modulation, comprising:
modulating an RF input data signal while generating and inserting additional pulses in transitions of the data signal, wherein the additional pulses are structured to shift transition noise into higher order harmonics; and filtering the higher order harmonics;
wherein the generating is conducted in the digital domain and wherein the filtering comprises applying a first-order filter.

5. A method for switching interval modulation, comprising:
modulating an RF input data signal while generating and inserting additional pulses in transitions of the data signal, wherein the additional pulses are structured to shift transition noise into higher order harmonics; and filtering the higher order harmonics;
wherein the generating is conducted in the digital domain and comprising generating the digital waveform with a series of pulses from an arbitrary modulation signal.

6. The method of claim 5, wherein the inserting is conducted independently of the of a duty cycle or pulse width of the arbitrary modulation signal.

7. A method for switching interval modulation, comprising:
modulating an RF input data signal while generating and inserting additional pulses in transitions of the data signal, wherein the additional pulses are structured to shift transition noise into higher order harmonics; and filtering the higher order harmonics;

wherein the generating is conducted in the digital domain and wherein a hybrid DRFM (direct RF modulation) system uses the additional pulses at the output of a transmitter to filter PA (power amplifier) distortion.

8. A method for switching interval modulation, comprising:

modulating an RF input data signal while generating and inserting additional pulses in transitions of the data signal, wherein the additional pulses are structured to shift transition noise into higher order harmonics; and filtering the higher order harmonics;

wherein the generating is conducted in the digital domain and wherein the additional pulses are applied to non-linear RF over fiber for a distributed MIMO (multiple input, multiple output system.

9. The method of claim 1, wherein, during generating, each subsequently added pulse is progressively wider.

* * * * *